United States Patent
Kanna et al.

(10) Patent No.: US 6,830,871 B2
(45) Date of Patent: Dec. 14, 2004

(54) CHEMICAL AMPLIFICATION TYPE RESIST COMPOSITION

(75) Inventors: Shinichi Kanna, Shizuoka (JP); Kazuyoshi Mizutani, Shizuoka (JP); Tomoya Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/642,182

(22) Filed: Aug. 18, 2003

(65) Prior Publication Data

US 2004/0053161 A1 Mar. 18, 2004

(30) Foreign Application Priority Data

Aug. 19, 2002 (JP) .................................. P. 2002-238122

(51) Int. Cl.$^7$ ............................. G03F 7/20; G03F 7/30; G03F 7/038
(52) U.S. Cl. .................. 430/270.1; 430/311; 430/319; 430/322; 430/325; 430/905; 430/907; 430/919
(58) Field of Search ........................... 430/270.1, 311, 430/319, 322, 325, 905, 907, 919

(56) References Cited

U.S. PATENT DOCUMENTS

| | | |
|---|---|---|
| 2002/0009668 A1 | 1/2002 | Nishimura et al. |
| 2002/0102490 A1 | 8/2002 | Ito et al. |
| 2003/0219679 A1 * | 11/2003 | Sasaki et al. ............ 430/270.1 |
| 2003/0232277 A1 * | 12/2003 | Sasaki et al. ............ 430/270.1 |

FOREIGN PATENT DOCUMENTS

| | | | |
|---|---|---|---|
| EP | 1367440 A2 * | 12/2003 | ........... G03F/7/039 |
| WO | WO 00/17712 A1 | 3/2000 | |
| WO | WO 02/36646 A1 | 5/2002 | |
| WO | WO 02/44815 A2 | 6/2002 | |

OTHER PUBLICATIONS

Ober et al. "New strategies for high resolution photoresists", Journal of Photopolymer Science and Technology 15(4)(2002), 603–611.*

R.R. Kunz et al. "Outlook for 157–nm resist design", SPIE vol. 3678 (1999), pp. 13–23.

Dirk Schmaljohann et al., Design Strategies for 157 nm Single–Layer Photoresists: Lithographic Evaluation of a Poly(αtrifluoromethyl vinly alcohol) Copolymer, SPIE vol. 3999 (2000), pp. 330–335.

Michael K. Crawford et al., "New Materials for 157 nm Photoresists: Characterization and Properties", SPIE vol. 3999 (2000), pp. 356–375.

* cited by examiner

*Primary Examiner*—Amanda Walke
(74) *Attorney, Agent, or Firm*—Sughrue Mion, PLLC

(57) ABSTRACT

A chemical amplification type resist composition comprising:

(a) a resin comprising repeating units having a side chain containing the specific partial structure and which increases the solubility in an alkaline developing solution by the action of an acid, (b) a compound capable of generating an acid upon irradiation with actinic rays or a radiation, (c) a low-molecular compound having a molecular weight of 3,000 or lower, wherein the value determined with the specific calculation formula is from 0.1 to 0.5, and (d) a solvent.

9 Claims, No Drawings

CHEMICAL AMPLIFICATION TYPE RESIST COMPOSITION

FIELD OF THE INVENTION

The present invention relates to a positive resist composition suitable for use in microlithography processes such as the production of ULSIs or high-capacity microchips and in other photofabrication processes. More particularly, the invention relates to a chemical amplification type resist composition capable of forming a high-resolution pattern with a vacuum ultraviolet light having a wavelength of 160 nm or shorter.

BACKGROUND OF THE INVENTION

The degree of integration in integrated circuits is increasing more and more, and it has become necessary to form an ultrafine pattern having a line width of a quarter micrometer or smaller in the production of semiconductor substrates for ULSIs or the like. One of the known techniques for enhancing the fineness of such patterns is to use an exposure light source having a shorter wavelength in resist pattern formation.

For example, in the production of semiconductor elements having an integration degree of up to 64 megabits, the i-line (365 nm) from an high-pressure mercury lamp has hitherto been used as an exposure light. Many compositions comprising a novolak resin and a naphthoquinonediazide compound as a photosensitive substance have been developed as positive resists for use with the exposure light, and have given sufficient results in forming patterns having line widths down to about 0.3 μm. On the other hand, in the production of semiconductor elements having an integration degree of 256 megabits or higher, KrF excimer laser beam (248 nm) has been used as an exposure light in place of the i-line.

Furthermore, use of ArF excimer laser beam (193 nm), which is an exposure light having an even shorter wavelength, and use of $F_2$ excimer laser beam (157 nm) for forming a pattern having a line width of 0.1 μm or smaller are recently being investigated for the purpose of producing semiconductor elements having an integration degree of 1 gigabit or higher.

With the use of such exposure lights having shorter wavelengths, the components of resist materials and the structures of compounds for use therein are changing considerably.

A so-called chemical amplification type resist has been developed as a resist composition for exposure to KrF excimer laser beam. This composition comprises a combination of: a resin, as the main component, having a poly(hydroxystyrene) backbone which shows reduced absorption in a 248 nm region and is protected by acid-decomposable groups; and a compound which generates an acid upon irradiation with far ultraviolet light (photo-acid generator).

Furthermore, another chemical amplification type resist has been developed as a resist composition for exposure to ArF excimer laser beam (193 nm). This composition contains an acid-decomposable resin which has, incorporated in the polymer main chain or side chains thereof, alicyclic structures showing no absorption at 193 nm.

With respect to use with $F_2$ excimer laser beam (157 nm), even the alicyclic resin shown above was found to be insufficient in obtaining a desired pattern of 0.1 μm or finer because the resin shows considerable absorption in a 157 nm region. Under these circumstances, a resin having fluorine atoms (perfluorinated structure) incorporated therein was reported to have sufficient transparency at 157 nm, in Proc. SPIE., Vol.3678, p.13 (1999). Effective structures of such fluororesins are proposed in Proc. SPIE., Vol.3999, p.330 (2000), p.357 (2000), and p.365 (2000) and in WO-00/17712, etc. Resist compositions containing a fluorine-containing resin have come to be investigated.

However, the fluororesin-containing resist compositions for exposure to $F_2$ excimer laser beam have problems concerning line edge roughness, etching rate, etc., and elimination of these problems have been desired.

Line edge roughness means a phenomenon in which resist line edges located at the interface between the resist line pattern and the substrate have a contour irregularly rugged in directions perpendicular to the line direction due to properties of the resist. When this pattern is viewed from right above, edges having recesses and protrusions (±about from several nanometers to tens of nanometers) are observed. Since these recesses and protrusions are transferred to the substrate in an etching step, large recesses and protrusions cause electrical failures, resulting in a reduced yield.

SUMMARY OF THE INVENTION

Accordingly, an object of the invention is to provide a chemical amplification type resist composition suitable for use with an exposure light source having a wavelength of 160 nm or shorter, in particular, $F_2$ excimer laser beam (157 nm). Specifically, the object is to provide a chemical amplification type resist composition which is sufficiently transparent to the exposure light having a wavelength of 157 nm, has high etching resistance, and is reduced in line edge roughness.

The present inventors made intensive investigations in view of the properties described above. As a result, they have found that the object of the invention is accomplished by the following specific composition. The invention has thus been achieved.

The invention has the following constitutions.

(1) A chemical amplification type resist composition comprising:

(a) a resin comprising repeating units having a side chain containing a partial structure represented by the following formula (I) and which increases the solubility in an alkaline developing solution by the action of an acid, (b) a compound capable of generating an acid upon irradiation with actinic rays or a radiation, (c) a low-molecular compound having a molecular weight of 3,000 or lower, wherein the value determined with the following calculation formula (1) is from 0.1 to 0.5:

[(number of carbon atoms)−(number of oxygen atoms)−0.5×(number of fluorine atoms)]/(number of all atoms)    (1)

and (d) a solvent:

$$\text{(I)}$$

[Structure of formula (I): featuring R50, R51, R52, R53, R54, R55 groups attached to carbons, with O-H and O-(CH2)n-W chain with R1 substituent]

wherein $R_{50}$ to $R_{55}$ each independently represents a hydrogen atom, a fluorine atom, or a fluoroalkyl group, provided that not all of $R_{50}$ to $R_{55}$ simultaneously represent hydrogen atoms and that $R_{55}$ may be bonded to an atom of the main chain of the resin through a connecting group or directly, $R_1$ represents a hydrogen atom or an alkyl group having 1 to 4 carbon atoms, W represents an organic group having 6 to 30 carbon atoms, and n represents an integer of 0 to 4.

(2) The composition according to the above (1), wherein the partial structures contained in side chains of the resin are represented by the following formula (I'):

$$\text{(I')}$$

[Structure of formula (I'): with CF3 groups, cyclohexane ring, and R50-R55, R1, W groups as in formula (I)]

wherein $R_{50}$ to $R_{55}$ each independently represents a hydrogen atom, a fluorine atom, or a fluoroalkyl group, provided that not all of $R_{50}$ to $R_{55}$ simultaneously represent hydrogen atoms, $R_1$ represents a hydrogen atom or an alkyl group having 1 to 4 carbon atoms, W represents an organic group having 6 to 30 carbon atoms, and n represents an integer of 0 to 4.

(3) The composition according to the above (1), further comprising a fluorine-based and/or silicon-based surfactant.

(4) The composition according to the above (1), further comprising as an acid diffusion inhibitor a basic compound having one or more nitrogen atoms.

(5) The composition according to the above (1), which is for irradiation with $F_2$ excimer laser beam having a wavelength of 157 nm.

(6) The composition according to the above (1), wherein the content of the repeating units is 10 to 90% by mole based on the component (a).

(7) The composition according to the above (1), wherein the value determined with the formula is from 0.1 to 0.45.

(8) The composition according to the above (1), wherein the molecular weight of the component (c) is from 100 to 2500.

(9) A method for forming a pattern, which comprises forming a resist film comprising the composition described in the above (1), exposing the resist film upon irradiation with the actinic rays or a radiation, and subsequently developing the resist film.

DETAILED DESCRIPTION OF THE INVENTION

The invention will be explained below in detail.

[1] (a) Resin Comprising Repeating Units having a Side Chain Containing a Partial Structure Represented by Formula (I) and Which Increases the Solubility in an Alkaline Developing Solution by the Action of an Acid The chemical amplification type resist composition of the invention contains a resin comprising repeating units having a side chain containing a partial structure represented by formula (I) and which increases the solubility in an alkaline developing solution by the action of an acid (hereinafter referred to also as "resin (a)").

In formula (I), $R_{50}$ to $R_{55}$ each independently represents a hydrogen atom, a fluorine atom, or a fluoroalkyl group, provided that not all of $R_{50}$ to $R_{55}$ simultaneously represent hydrogen atoms and that $R_{55}$ may be bonded to an atom of the main chain of the resin through a connecting group or directly.

$R_1$ represents a hydrogen atom or an alkyl group having 1 to 4 carbon atoms.

W represents an organic group which has 6 to 30 carbon atoms and may have one or more atoms selected from fluorine, oxygen, nitrogen, and sulfur atoms.

Symbol n represents an integer of 0 to 4.

The fluoroalkyl groups represented by $R_{50}$ to $R_{55}$ each is an alkyl group in which at least one of the hydrogen atoms has been replaced by fluorine. The fluoroalkyl groups each has preferably 1 to 6 carbon atoms, more preferably 1 to 3 carbon atoms. Examples of the fluoroalkyl groups include trifluoromethyl group, difluoromethyl group, fluoromethyl group, pentafluoroethyl group, 2,2,2-trifluoroethyl group, 2-fluoroethyl group, 3,3,3-trifluoropropyl group, and 3-fluoropropyl group. Especially preferred is trifluoromethyl group.

The fluoroalkyl groups represented by $R_{50}$ to $R_{55}$ each may have one or more substituents. Examples of the substituents include a chlorine atom, a bromine atom, and an iodine atom.

$R_{50}$ to $R_{55}$ each preferably is a fluorine atom or trifluoromethyl group.

The alkyl group represented by $R_1$ is an alkyl group having 1 to 4 carbon atoms. Examples thereof include methyl group, ethyl group, propyl group, n-butyl group, and sec-butyl group.

The organic group represented by W is an organic group having 6 to 30, preferably 6 to 20 carbon atoms. Examples thereof include linear, branched, or cyclic alkyl groups (preferably having 1 to 20 carbon atoms) which may have one or more substituents, aryl groups (preferably having 6 to 15 carbon atoms) which may have one or more substituents, acyl groups (preferably having 1 to 12 carbon atoms) which may have one or more substituents, and alkoxycarbonyl groups (preferably having 2 to 5 carbon atoms) which may have one or more substituents.

This organic group may contain one or more atoms selected from a fluorine atom, an oxygen atom, a nitrogen atom, and a sulfur atom.

Symbol n represents an integer of 0 to 4, and preferably is 0 to 2.

In the invention, the repeating units having a side chain containing a partial structure represented by formula (I) are not particularly limited. However, preferred examples of the repeating units include repeating units represented by the following formulae (IA) to (ID).

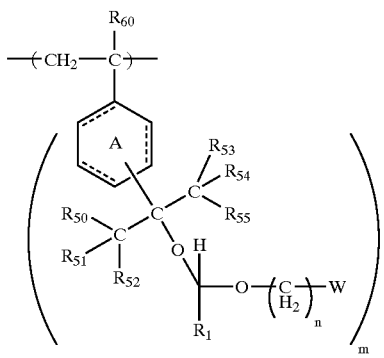

IA

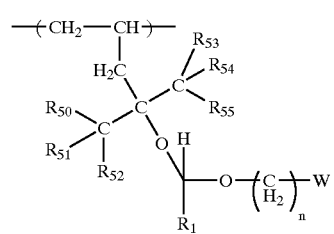

IB

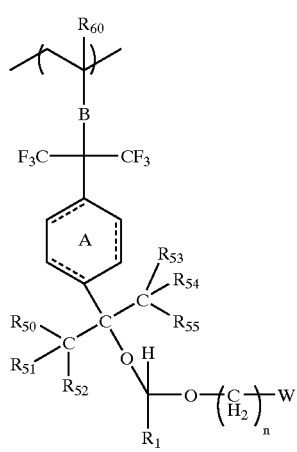

IC

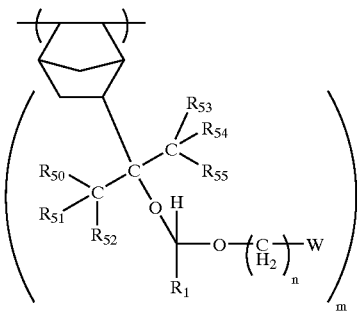

ID

In the formulae, $R_{50}$ to $R_{55}$, $R_1$, W, and n are the same as defined above with regard to formula (I). Symbol m represents 1 or 2. Ring A represents phenylene or cyclohexylene. $R_{60}$ represents a hydrogen atom, methyl group, a fluorine atom, a trifluoromethyl group, or a cyano group. B represents a bivalent connecting group.

The bivalent connecting group is a bivalent group selected from an alkylene group, cycloalkylene group, alkenylene group, arylene group, —O—CO—$R_{22a}$—, —CO—O—$R_{22b}$—, and —CO—N($R_{22c}$) —$R_{22d}$— which each may have one or more substituents. $R_{22a}$, $R_{22b}$, and $R_{22d}$ may be the same or different and each represent a single bond or a bivalent group which is an alkylene, cycloalkylene, alkenylene, or arylene group optionally having an ether group, ester group, amide group, urethane group, or ureido group. $R_{22c}$ represents a hydrogen atom or an alkyl, cycloalkyl, aralkyl, or aryl group, which may have one or more substituents.

Examples of the alkylene group include linear and branched alkylene groups having 1 to 8 carbon atoms. Specific examples thereof include methylene group, ethylene group, propylene group, butylenes group, hexylene group, and octylene group.

Examples of the cycloalkylene group include ones having 5 to 8 carbon atoms, such as cyclopentylene group and cyclohexylene group.

Preferred examples of the alkenylene group include ones having 2 to 6 carbon atoms, such as ethenylene group, propenylene group, and butenylene group. Such alkenylene groups may have one or more substituents.

Preferred examples of the arylene group include ones having 6 to 15 carbon atoms, such as phenylene group, tolylene group, and naphthylene group. Such arylene groups may have one or more substituents.

The bivalent connecting group represented by B especially preferably is a group having an ether bond or ester bond.

In the invention, the partial structures described above preferably are ones represented by formula (I').

In formula (I'), $R_{50}$ to $R_{55}$, $R_1$, W, and n are the same as defined above with regard to formula (I).

Preferred examples (I-1) to (I-32) of the repeating units having a side chain containing a partial structure represented by formula (I) are shown below. However, the repeating units in the invention should not be construed as being limited to these examples.
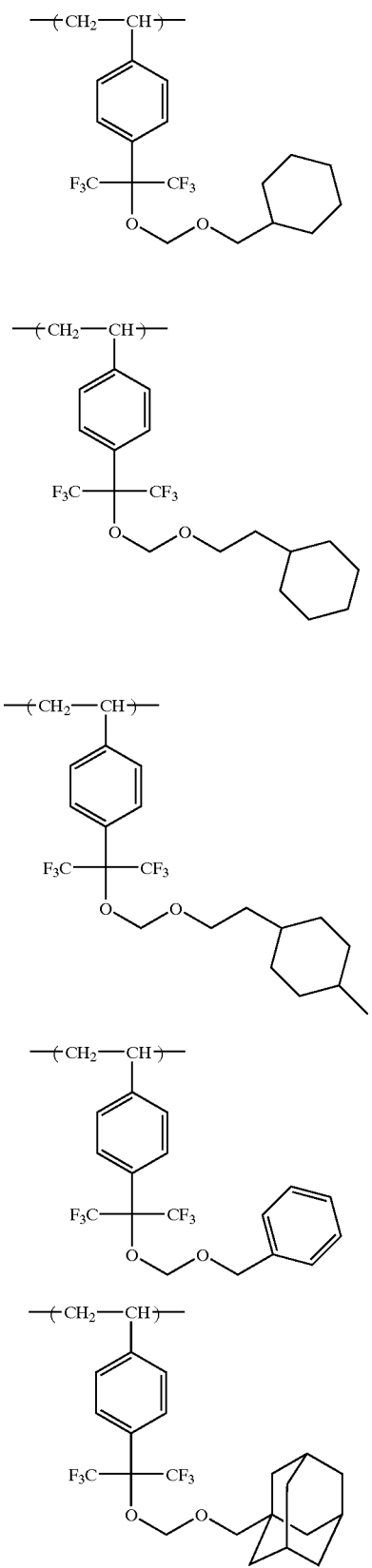
(I-1)
(I-2)
(I-3)
(I-4)
(I-5)
-continued
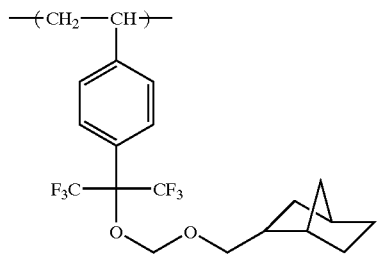
(I-6)
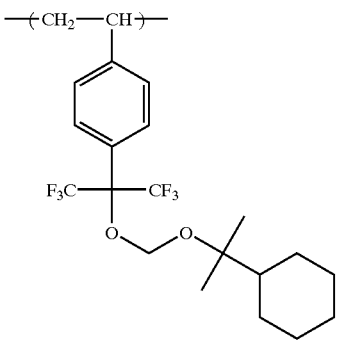
(I-7)
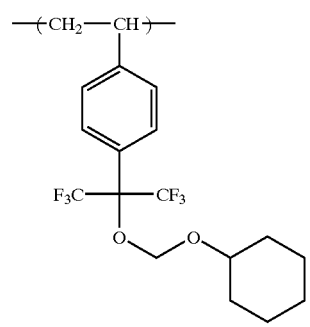
(I-8)
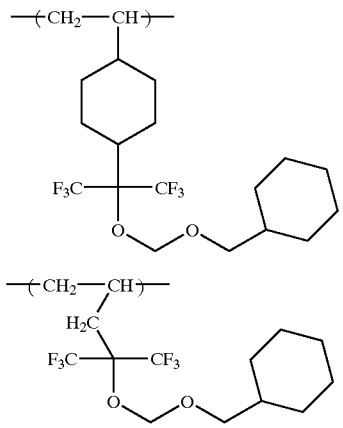
(I-9)
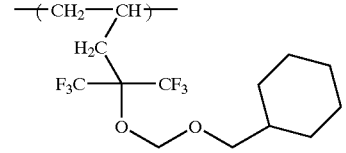
(I-10)
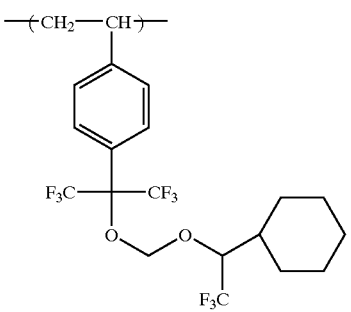
(I-11)

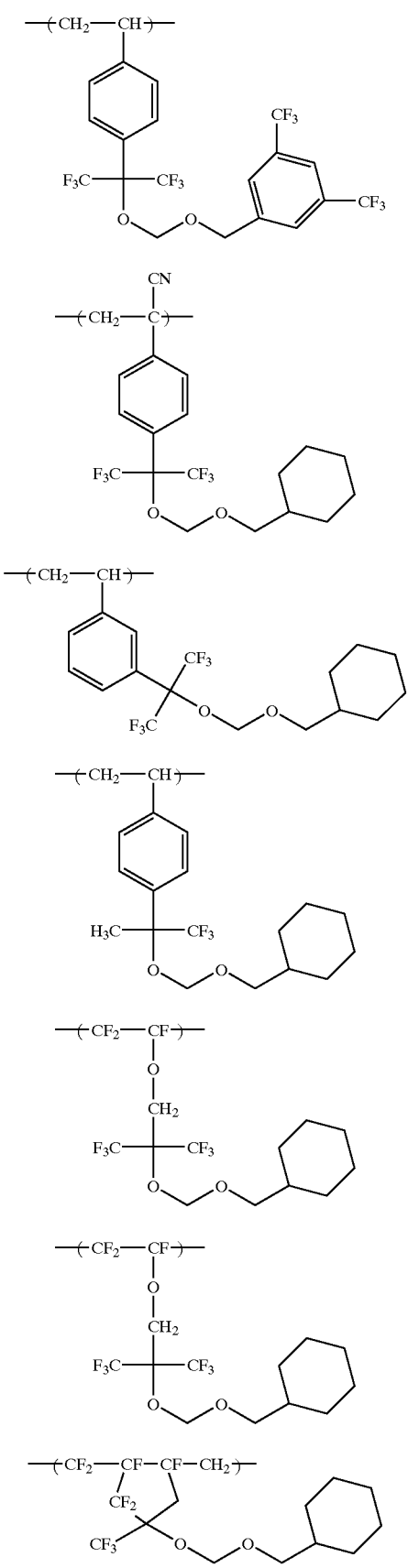
(I-12)
(I-13)
(I-14)
(I-15)
(I-16)
(I-17)
(I-18)
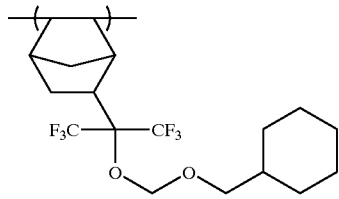
(I-19)
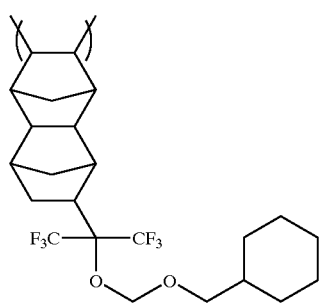
(I-20)
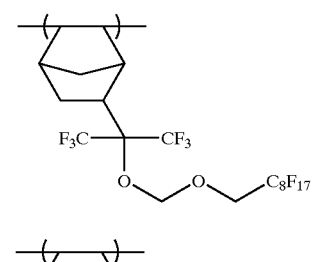
(I-21)
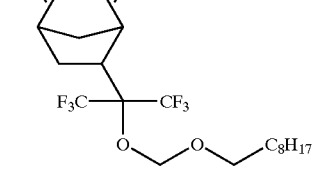
(I-22)
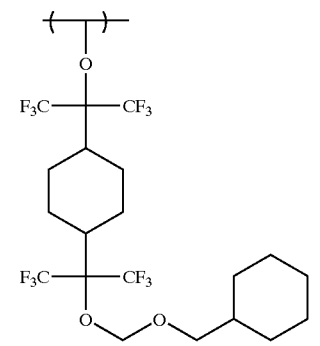
(I-23)
(I-24)

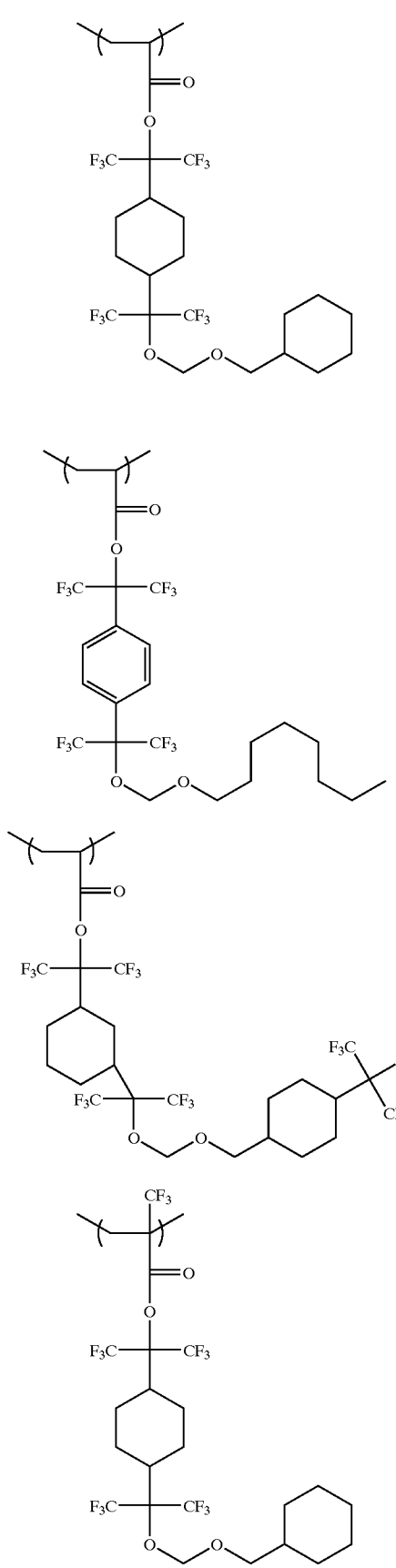
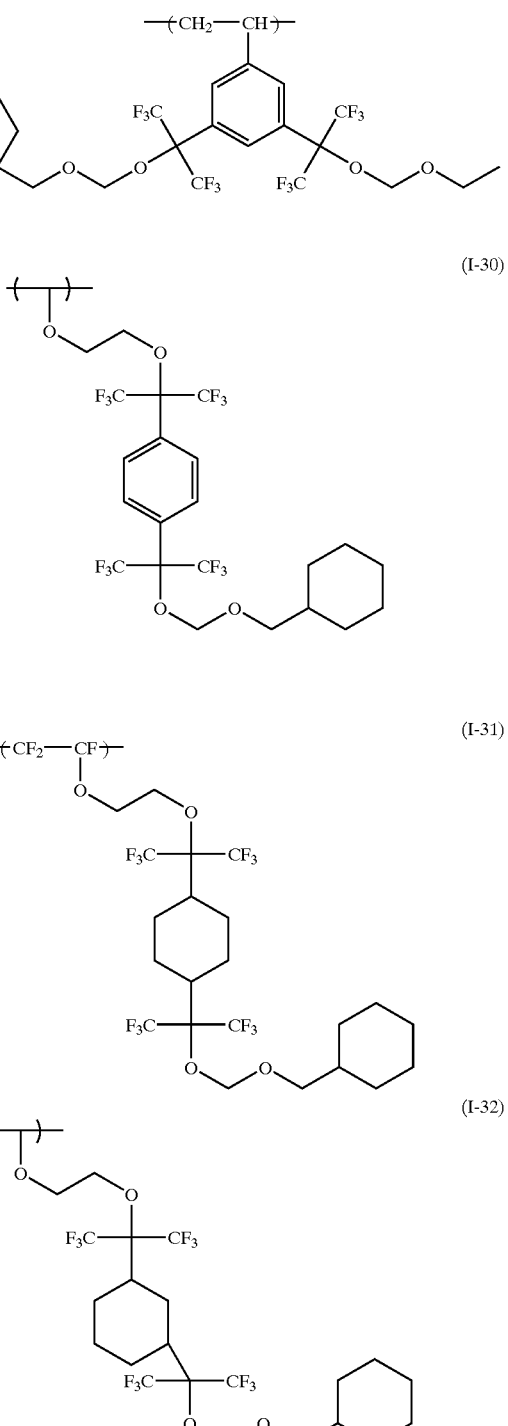
The resin (a) according to the invention may contain one or more kinds of other repeating units besides the repeating units having a side chain containing the specific partial structure described above. Examples of such other repeating units include repeating units represented by the following formulae (II) to (IV).

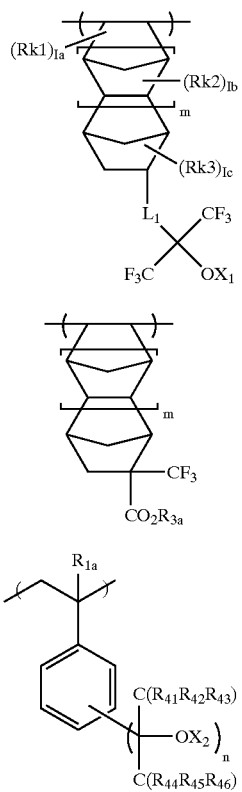

In formula (II), Rk1, Rk2 and Rk3 each independently represents a halogen atom, an alkyl group, or an alkoxy group. $L_1$ represents a single bond, a divalent connecting group. $X_1$ represents a group dissociating by the action of an acid. Symbol m represents 0 or 1. 1a, 1b and 1c each independently represents an integer of 1 to 4.

In formula (III), $R_3$ represents a hydrogen atom or a group dissociating by the action of an acid, and m represents 0 or 1.

In formula (IV), $R_{1a}$ represents a hydrogen atom, a fluorine atom, a chlorine atom, a bromine atom, a cyano group, or a trifluoromethyl group. $R_{41}$ to $R_{46}$ each independently represents a hydrogen atom, a fluorine atom, or a fluoroalkyl group, provided that not all of $R_{41}$ to $R_{43}$ simultaneously represent hydrogen atoms. $X_2$ represents a hydrogen atom or a group dissociating by the action of an acid. Symbol n represents an integer of 1 to 5. When n is 2 or larger, the two or more $R_{41}$'s to $R_{46}$'s and $X_2$'s each may be the same or different.

The repeating units represented by formulae (II) to (IV) will be explained below in detail.

Examples of the halogen atoms represented by Rk1, Rk2 and Rk3 in formula (II) include a fluorine atom, a chlorine atom, a bromine atom and an iodine atom. The alkyl groups represented by Rk1, Rk2 and Rk3 preferably are alkyl groups having 1 to 5 carbon atoms. Examples thereof include methyl group, ethyl group, propyl group, n-butyl group, sec-butyl group, tert-butyl group. The alkyl groups represented by Rk1, Rk2 and Rk3 may have one or more substituents. The alkyl groups having one or more substituents preferably are perfluoro alkyl groups wherein the all hydrogen atoms in the alkyl groups as above are substituted with the fluorine atoms.

The alkoxy groups represented by Rk1, Rk2 and Rk3 preferably are alkoxy groups having 1 to 5 carbon atoms. Examples thereof include methoxy group, ethoxy group, propoxy group, n-butoxy group.

The bivalent connecting group represented by $L_1$ is a bivalent group selected from an alkylene group, cycloalkylene group, alkenylene group, arylene group, —O—$R_{22a}$—, —O—C(=O)—$R_{22b}$—, —C(=O)—O—$R_{22c}$—, and —C(=O)—N($R_{22d}$)—$R_{22e}$— which each may have one or more substituents. $R_{22a}$, $R_{22b}$, $R_{22c}$ and $R_{22e}$ may be the same or different and each represent a single bond or a bivalent group which is an alkylene, cycloalkylene, alkenylene, or arylene group optionally having an ether group, ester group, amide group, urethane group, or ureido group. $R_{22d}$ represents a hydrogen atom or an alkyl group (preferably having 1 to 5 carbon atoms), a cycloalkyl group (preferably having 3 to 10 carbon atoms), an aralkyl group (preferably having 7 to 10 carbon atoms), or aryl group (preferably having 6 to 10 carbon atoms), which may have one or more substituents.

Examples of the alkylene group include linear and branched alkylene groups having 1 to 8 carbon atoms. Specific examples thereof include methylene group, ethylene group, propylene group, butylenes group, hexylene group, and octylene group.

The cycloalkylene group are preferably ones having 5 to 12 carbon atoms. Examples thereof include monocyclic residues such as cyclopentylene group and cyclohexylene group, and polycyclic residues such as norbornane bone and adamantane bone.

Preferred examples of the alkenylene group include ones having 2 to 6 carbon atoms, such as ethenylene group, propenylene group, and butenylene group. Such alkenylene groups may have one or more substituents.

Preferred examples of the arylene group include ones having 6 to 15 carbon atoms, such as phenylene group, tolylene group, and naphthylene group. Such arylene groups may have one or more substituents.

Examples of the substituents which may be possessed by the bivalent connecting group represented by $L_1$ include halogen atoms such as a fluorine atom and a chlorine atom, a cyano group, and a cyano group is preferable among them.

The bivalent connecting group represented by $L_1$ is preferably a single bond, —O— group.

Examples of the group dissociating by the action of an acid (hereinafter referred to also as "acid-decomposable group") represented by $X_1$ include —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$), and —C($R_{01}$)($R_{02}$)COO—C($R_{36}$)($R_{37}$)($R_{38}$).

$R_{36}$ to $R_{39}$ each independently represents an alkyl group which may have one or more substituents, cycloalkyl group which may have one or more substituents, alkenyl group which may have one or more substituents, aralkyl group which may have one or more substituents, or aryl group which may have one or more substituents, provided that $R_{36}$ and $R_{39}$ may be bonded to each other to form a ring.

$R_{01}$ and $R_{02}$ each independently represents a hydrogen atom, alkyl group which may have one or more substituents, cycloalkyl group which may have one or more substituents, alkenyl group which may have one or more substituents, aralkyl group which may have one or more substituents, or aryl group which may have one or more substituents.

The alkyl groups represented by $R_{36}$ to $R_{39}$, $R_{01}$, and $R_{02}$ preferably are alkyl groups having 1 to 8 carbon atoms. Examples thereof include methyl group, ethyl group, propyl group, n-butyl group, sec-butyl group, hexyl group, 2-ethylhexyl group, and octyl group.

The cycloalkyl groups represented by $R_{36}$ to $R_{39}$, $R_{01}$, and $R_{02}$ may be monocyclic or polycyclic. The monocyclic groups preferably are cycloalkyl groups having 3 to 8 carbon atoms, and examples thereof include cyclopropyl group, cyclopentyl group, cyclohexyl group, cyclobutyl group, and cyclooctyl group. The polycyclic groups preferably are cycloalkyl groups having 6 to 20 carbon atoms, and examples thereof include adamantyl group, norbornyl group, isobornyl group, camphanyl group, dicyclopentyl group, α-pinel group, tricyclodecanyl group, tetracyclododecyl group, and androstanyl group. In the cycloalkyl groups, part of the carbon atoms may have been replaced by a heteroatom, e.g., oxygen atom.

The aryl groups represented by $R_{36}$ to $R_{39}$, $R_{01}$, and $R_{02}$ preferably are aryl groups having 6 to 10 carbon atoms. Examples thereof include phenyl, tolyl group, dimethylphenyl group, 2,4,6-trimethylphenyl group, naphthyl group, anthryl group, and 9,10-dimethoxyanthryl group.

The aralkyl groups represented by $R_{36}$ to $R_{39}$, $R_{01}$ and $R_{02}$ preferably are aralkyl groups having 7 to 12 carbon atoms. Examples thereof include benzyl group, phenethyl group, and naphthylmethyl group.

The alkenyl groups represented by $R_{36}$ to $R_{39}$, $R_{01}$, and $R_{02}$ preferably are alkenyl groups having 2 to 8 carbon atoms. Examples thereof include vinyl group, allyl group, butenyl group, and cyclohexenyl group.

Examples of the substituents which may be possessed by $R_{36}$ to $R_{39}$, $R_{01}$, and $R_{02}$ include alkyl groups, cycloalkyl groups, aryl groups, amino group, amide group, ureido group, urethane group, hydroxy group, carboxy group, halogen atoms, alkoxy groups, thioether groups, acyl groups, acyloxy groups, alkoxycarbonyl groups, cyano group, and nitro group.

Preferred examples of the acid-decomposable group include acetal groups such as 1-alkoxy-1-ethoxy groups, 1-alkoxy-1-methoxy groups, and tetrahydropyranyl group, t-alkyloxycarbonyl groups, ethoxymethyl group, methoxyethoxymethyl group, and t-alkylcarbonylmethyl groups.

The sum of 1a, 1b and 1c is preferably 0 to 5, more preferably 0 to 3.

Preferred examples of the repeating units represented by formula (II) are shown below, but these repeating units which may be contained in the resin (a) according to the invention should not be construed as being limited to the following examples.

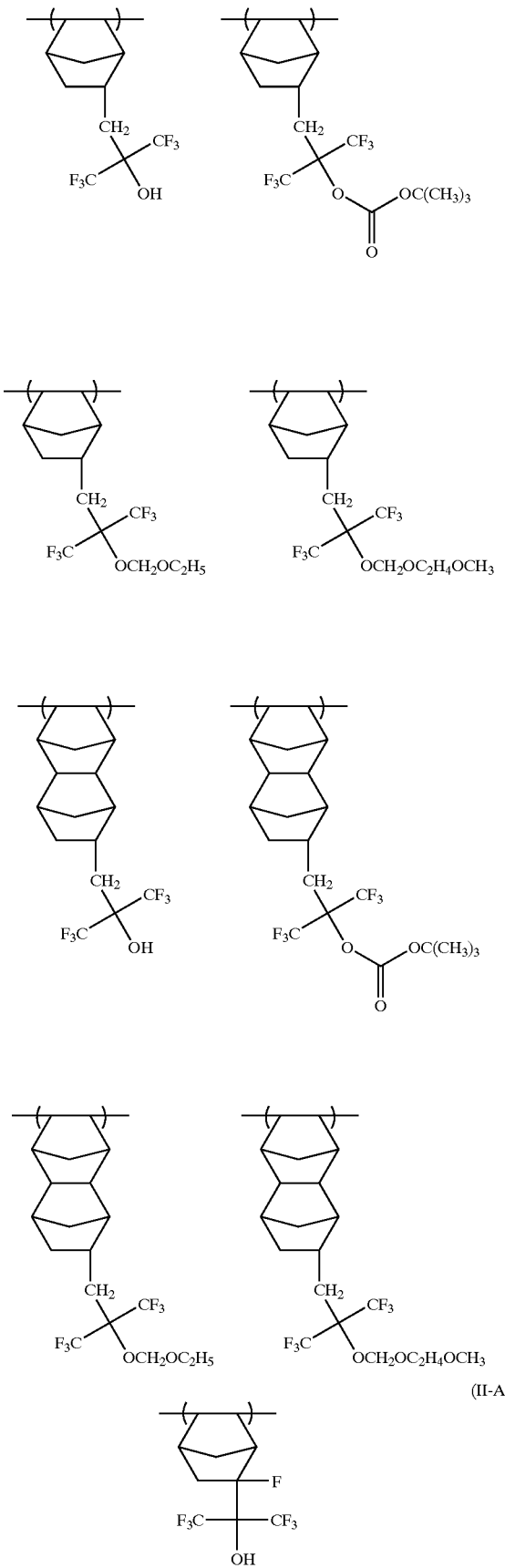

(II-B)
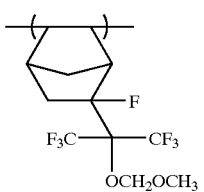
(II-C)
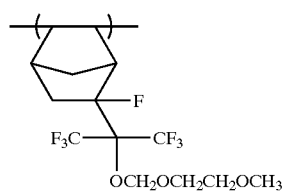
(II-D)
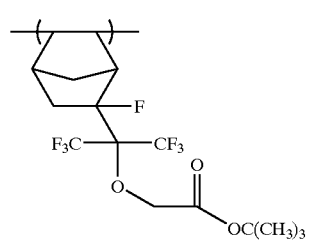
(II-E)
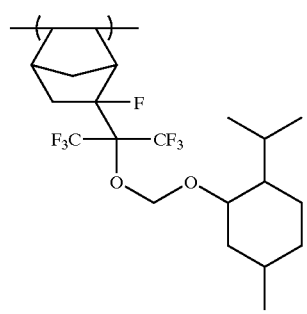
(II-F)
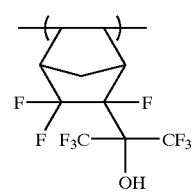
(II-G)
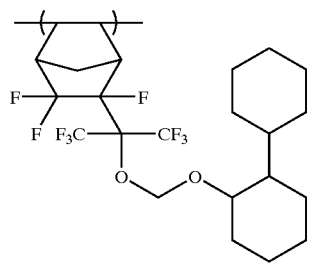
(II-H)
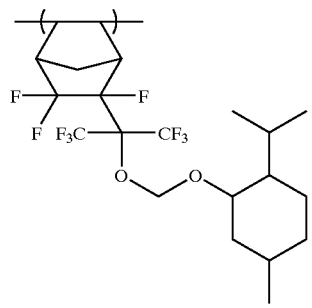
(II-I)
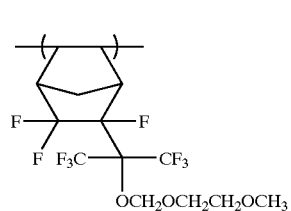
(II-J)
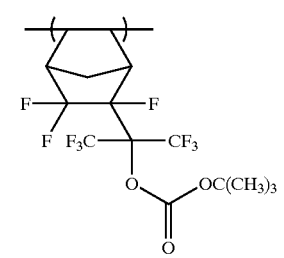
(II-K)
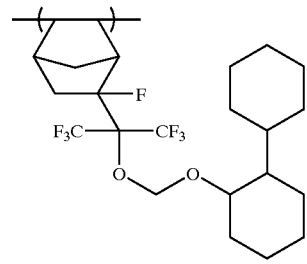
(II-L)
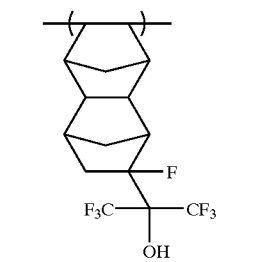
(II-M)
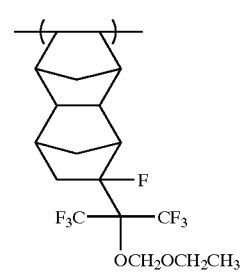

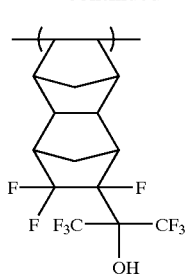
(II-N)

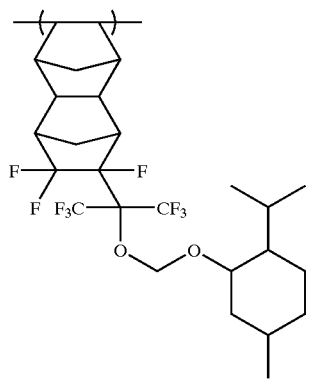
(II-O)

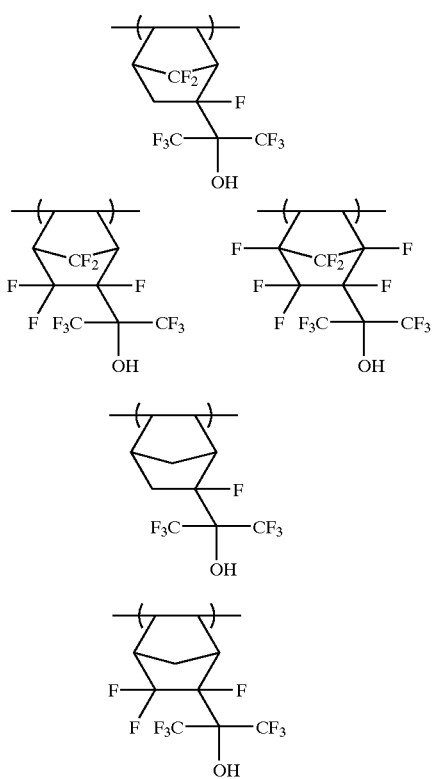
(II-P)
(II-Q)
(II-R)

In formula (III), examples of $R_{3a}$, which represents a group dissociating by the action of an acid, include —$C(R_{36})(R_{37})(R_{38})$ and —$C(R_{36})(R_{37})(OR_{39})$. $R_{36}$ to $R_{39}$ have the same meanings as in formula (II).

Preferred examples of the group represented by $R_{3a}$, which is a group dissociating by the action of an acid, in formula (III) include tertiary alkyl groups such as t-butyl, t-amyl, 1-alkyl-1-cyclohexyl groups, 2-alkyl-2-adamantyl groups, 2-adamantyl-2-propyl, and 2-(4-methylcyclohexyl)-2-propyl, acetal groups such as 1-alkoxy-1-ethoxy groups, 1-alkoxy-1-methoxy groups, and tetrahydropyranyl, and t-alkylcarbonylmethyl groups. Preferred of these are the tertiary alkyl groups. Especially preferred are the tertiary alkyl groups having an alicycle.

Preferred examples of the repeating units represented by formula (III) are shown below, but these repeating units which may be contained in the resin (a) according to the invention should not be construed as being limited to the following examples.

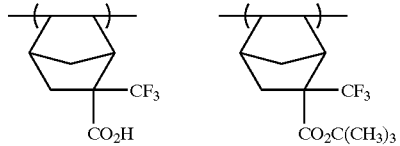

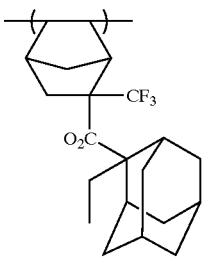 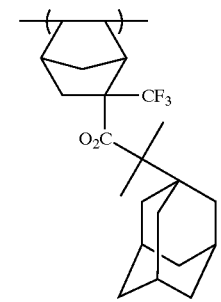

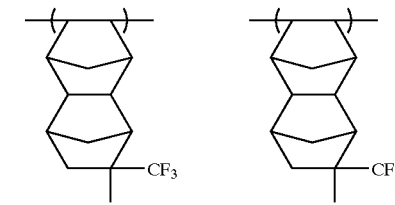

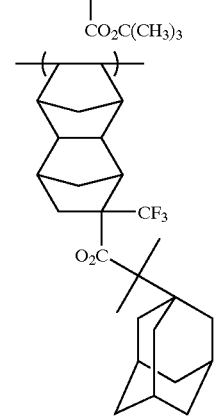

In formula (IV), examples of the fluoroalkyl groups represented by $R_{41}$ to $R_{46}$ include the same fluoroalkyl groups enumerated above as examples of $R_{50}$ to $R_{55}$ in formula (I).

—$C(R_{41}R_{42}R_{43})$ group represents a group wherein groups represented by $R_{41}$, $R_{42}$ and $R_{43}$ each is bonded to the carbon atom with a single bond.

Examples of the group represented by $X_2$, which is a group dissociating by the action of an acid, include the same groups enumerated above as examples of the group $X_1$ dissociating by the action of an acid in formula (II).

Preferred examples of the repeating units represented by formula (IV) are shown below, but these repeating units which may be contained in the resin (a) according to the invention should not be construed as being limited to the following examples.

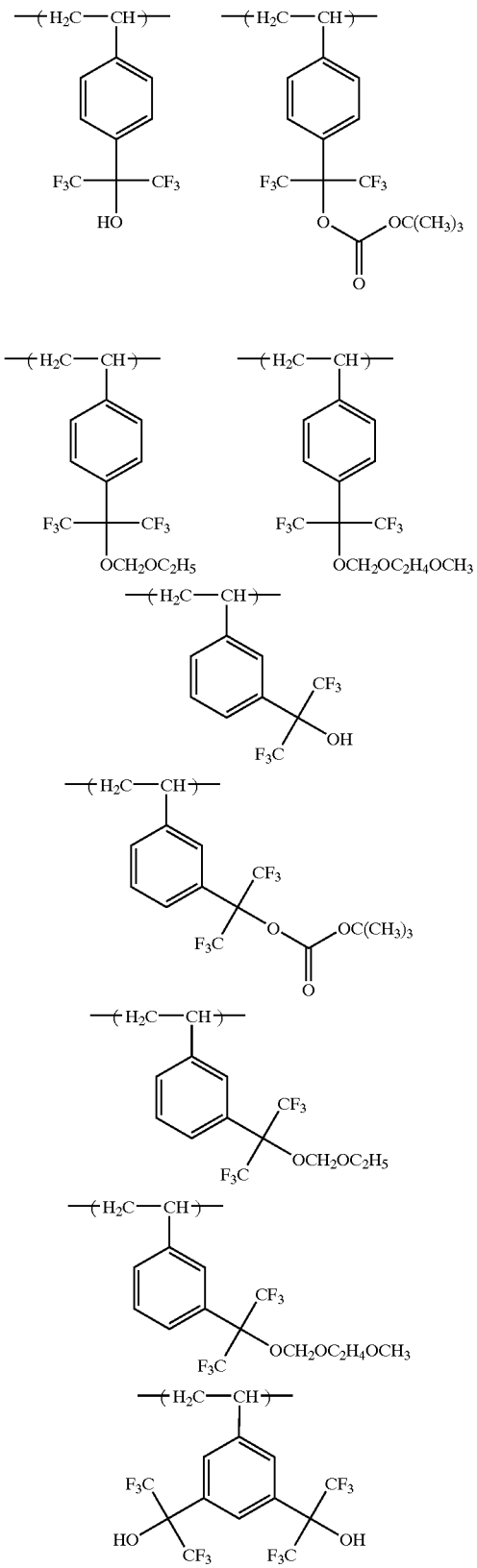

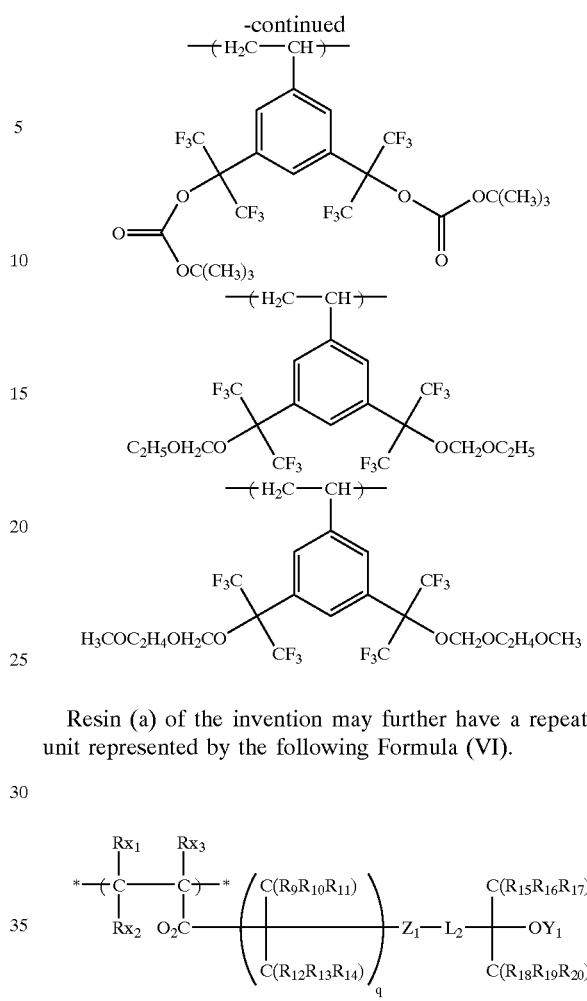

Resin (a) of the invention may further have a repeating unit represented by the following Formula (VI).

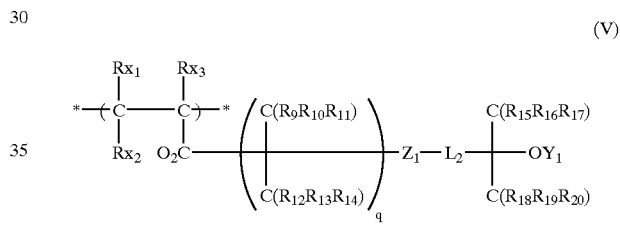

(V)

In Formula (V), $Rx_1$ to $Rx_3$ each independently represents a hydrogen atom, a fluorine atom, a chlorine atom, a cyano group or an alkyl group in which at least one hydrogen atom is substituted with a fluorine atom. $R_9$ to $R_{20}$ each independently represents a hydrogen atom, a fluorine atom or an alkyl group with the condition that at least one of $R_9$ to $R_{14}$ is a fluorine atom and that at least one of $R_{15}$ to $R_{20}$ is a fluorine atom. $Z_1$ represents a phenylene group, a cyclohexylene group, an admantane residue or a norbornane residue. $L_2$ represents a single bond or a divalent connecting group. $Y_1$ represents a hydrogen atom or an organic group, and q represents an integer of 0 or 1.

The alkyl group in which at least one hydrogen atom is substituted with a fluorine atom in Formula (V) is preferably an alkyl group with one to 5 carbon atoms in which at least one hydrogen atom is substituted with a fluorine atom, exemplified by trifluoromethyl, difluoromethyl, fluoromethyl, perfluoroethyl, perfluoropropyl, etc.

The alkyl group for $R_9$ to $R_{20}$ is preferably an alkyl group with one to 5 carbon atoms, exemplified by methyl, ethyl, propyl, n-butyl, sec-butyl, etc. The alkyl group for $R_9$ to $R_{20}$ may have a substituent. The substituent that the alkyl group for $R_9$ to $R_{20}$ may have includes, for example, a fluorine atom.

$Z_1$ may have a substituent. As the substituent that $Z_1$ may have, a halogen atom, a hydroxyl group, an alkoxy group (preferably having one to 5 carbon atoms), a cyano group, etc. can be mentioned as examples. Preferable substituents that $Z_1$ may have are a fluorine atom and a hydroxyl group, and a more preferable one is a fluorine atom. In cases where $Z_1$ has a fluorine atom as a substituent, the number of fluorine atom is preferably 1 to 5, and more preferably 1 to 3.

The divalent connecting group represented by $L_2$ is the same as the divalent connecting group represented by $L_1$ in Formula (II).

As the organic group represented by $Y_1$, one can mention an acid-decomposable group which is detachable from an oxygen atom by the action of acid, and a non-acid-decomposable group which is not detached from an oxygen atom by the action of acid.

The acid-decomposable group represented by $Y_1$ includes, for example, —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), etc.

In the formulae, $R_{36}$ to $R_{39}$ each independently represent an alkyl group, a cycloalkyl group, an aryl group, an aralkyl group or an alkenyl group. $R_{36}$ together with $R_{37}$ or $R_{36}$ together with $R_{39}$ may form a ring via mutual connection.

$R_{01}$ to $R_{02}$ each independently represents a hydrogen atom, an alkyl group, a cycloalkyl group, an aryl group, an aralkyl group or an alkenyl group.

The alkyl group represented by $R_{36}$ to $R_{39}$ and $R_{01}$ to $R_{02}$ is preferably an alkyl group with one to 8 carbon atoms such as, for example, methyl, ethyl propyl, n-butyl, sec-butyl, hexyl, octyl, etc.

The cycloalkyl group represented by $R_{36}$ to $R_{39}$ and $R_{01}$ to $R_{02}$ may be monocyclic or polycyclic. As the monocyclic cycloalkyl group, those with 3 to 8 carbon atoms are preferred such as, for example, cylcopropyl, cyclobutyl, cyclopentyl, cyclohexyl, cyclooctyl, etc. As the polycyclic cycloalkyl group, those with 6 to 20 carbon atoms are preferred such as, for example, adamantyl, norbornyl, isobornyl, camphanyl, dicyclopentyl, α-pinel, tricyclodecanyl, tetracyclododecyl, androstanyl, etc. By way of precaution, part of the carbon atoms in the cycloalkyl group may be substituted by a hetero atom such as oxygen, etc.

The aryl group represented by $R_{36}$ to $R_{39}$ and $R_{01}$ to $R_{02}$ is preferably those with 6 to 10 carbon atoms such as, for example, phenyl, naphthyl, anthryl, etc.

The aralkyl group represented by $R_{36}$ to $R_{39}$ and $R_{01}$ to $R_{02}$ is preferably those with 7 to 12 carbon atoms such as, for example, benzyl, phenethyl, naphtylmethyl, etc.

The alkenyl group represented by $R_{36}$ to $R_{39}$ and $R_{01}$ to $R_{02}$ is preferably those with 2 to 8 carbon atoms such as, for example, vinyl, allyl, butenyl, cyclohexenyl, etc.

As the substituent that $R_{36}$ to $R_{39}$ and $R_{01}$ to $R_{02}$ may have, an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, etc. can be mentioned.

The non-acid-decomposable group represented by $Y_1$ includes, for example, an alkyl group, a cycloalkyl group, an aryl group, an aralkyl group, an alkenyl group, etc. all of which are not detached from an oxygen atom by the action of acid.

The non-acid-decomposable alkyl group represented by $Y_1$ is preferably an alkyl group with one to 8 carbon atoms such as, for example, methyl, ethyl, propyl, n-butyl, sec-butyl, hexyl, octyl, etc.

The non-acid-decomposable cycloalkyl group represented by $Y_1$ may be monocyclic or polycyclic. As the monocyclic cycloalkyl group, those with 3 to 8 carbon atoms are preferred such as, for example, cylcopropyl, cyclobutyl, cyclopentyl, cyclohexyl, cyclooctyl, etc. As the polycyclic cycloalkyl group, those with 6 to 20 carbon atoms are preferred such as, for example, adamantyl, norbornyl, isobornyl, camphanyl, dicyclopentyl, α-pinel, tricyclodecanyl, tetracyclododecyl, androstanyl, etc. By way of precaution, part of the carbon atoms in the cycloalkyl group may be substituted by a hetero atom such oxygen, etc.

The non-acid-decomposable aryl group represented by $Y_1$ is preferably those with 6 to 10 carbon atoms such as, for example, phenyl, naphthyl, anthryl, etc.

The non-acid-decomposable aralkyl group represented by $Y_1$ is preferably those with 7 to 12 carbon atoms such as, for example, benzyl, phenethyl, naphtylmethyl, etc.

The non-acid-decomposable alkenyl group represented by $Y_1$ is preferably those with 2 to 8 carbon atoms such as, for example, vinyl, allyl, butenyl, cyclohexenyl, etc.

As the substituent that the non-acid-decomposable $Y_1$ may have, an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, etc. can be mentioned.

In the following, practical examples of the repeating unit represented by Formula (V) are enumerated, but the scope of the invention is not restricted by those examples at all.

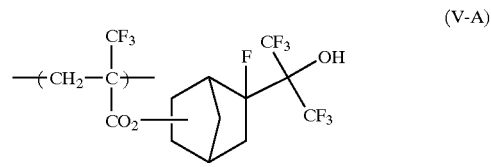

(V-A)

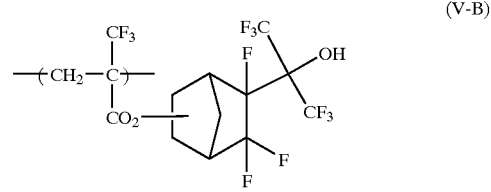

(V-B)

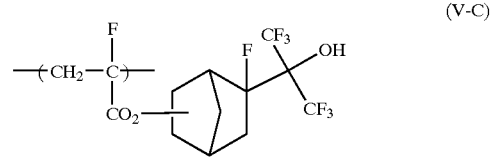

(V-C)

-continued

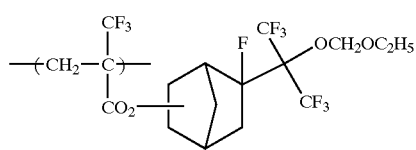
(V-D)

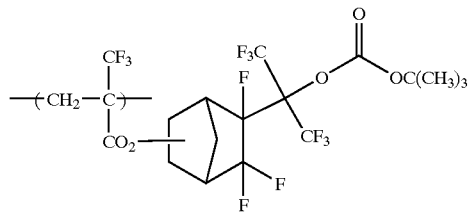
(V-E)

Resin (a) of the invention may further have a repeating unit represented by the following Formula (VI).

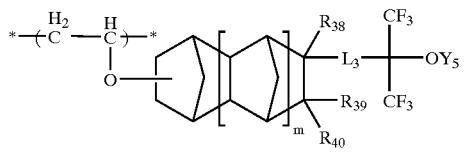
(VI)

In Formula (VI), $R_{38}$ to $R_{40}$ each independently represents a hydrogen atom, a halogen atom, a hydroxyl group, a cyano group, an alkyl group, an aryl group, an alkoxy group or an aralkyl group. $L_3$ represents a single bond or a divalent connecting group. $Y_5$ represents a hydrogen atom or an organic group, and m represents an integer of 0 or 1.

The halogen atom as $R_{38}$ to $R_{40}$ in Formula (VI) includes a fluorine atom, a chlorine atom, a bromine atom and an iodine atom.

The alkyl group represented by $R_{38}$ to $R_{40}$ is preferably those with one to 5 carbon atoms such as, for example, methyl group, ethyl group, propyl group, n-butyl group, sec-butyl group, t-butyl group, etc.

The aryl group represented by $R_{38}$ to $R_{40}$ is preferably those with 6 to 10 carbon atoms such as, for example, phenyl group, naphthyl group, anthryl group, etc.

The alkoxy group represented by $R_{38}$ to $R_{40}$ is preferably those with 1 to 5 carbon atoms such as, for example, methoxy, ethoxy, propoxy, n-butoxy, etc.

The aralkyl group represented by $R_{38}$ to $R_{40}$ is preferably those with 7 to 12 carbon atoms such as, for example, benzyl group, phenethyl group, naphthylmethyl group, etc.

As the substituent that the alkyl group, aryl group, etc. represented by $R_{38}$ to $R_{40}$ may have, an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, etc. can be mentioned.

Each of $R_{38}$ to $R_{40}$ is preferably a hydrogen atom or a halogen atom, more preferably a fluorine atom, and a particularly preferable case is that $R_{38}$ is a fluorine atom.

As the divalent connecting group represented by $L_3$, one can mention those for the divalent connecting group represented by $L_1$ in Formula (II).

As the organic group represented by $Y_8$, one can mention those represented by $Y_1$ in Formula (V).

In the following, practical examples of the repeating unit represented by Formula (VI) are enumerated, but the scope of the invention is not restricted by those examples at all.

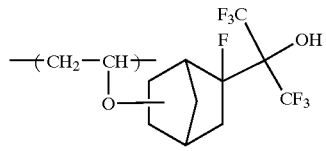
(VI-A)

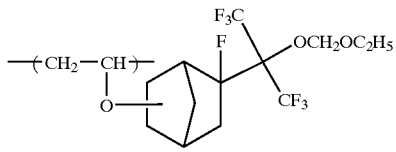
(VI-B)

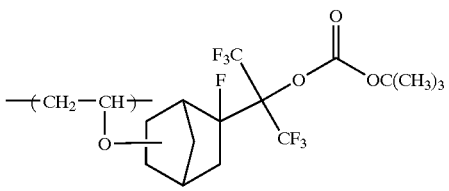
(VI-C)

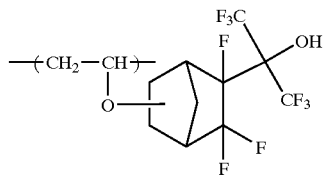
(VI-D)

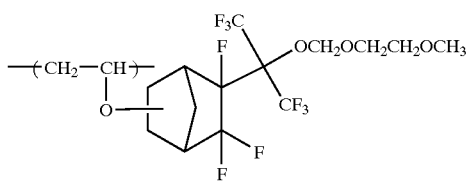
(VI-E)

Other polymerizable monomers may be polymerized in producing the resin (a) besides monomers for forming the repeating units described above.

Examples of usable comonomers include acrylic esters, acrylamide and derivatives thereof, methacrylic esters, methacrylamide and derivatives thereof, allyl compounds, vinyl ethers, vinyl esters, styrene and derivatives thereof, crotonic esters, dialkyl esters of maleic acid or fumaric acid, maleic anhydride, maleimide and derivatives thereof, acrylonitrile, methacrylonitrile, maleonitrile, and $C(R_{1a})(R_{2a})=C(R_{3a})(R_{4a})$ (wherein $R_{1a}$ to $R_{4a}$ may be the same or different, and each represent a hydrogen atom, halogen atom, or alkyl group (preferably having 1 to 10 carbon atoms) which may be substituted with one or more halogen atoms). Especially preferred are acrylic ester represented by the following formula (B-15-B) or (B-15-C), acrylonitrile, methacrylonitrile, maleic anhydride, maleimide, N-hydroxymaleimide, N-(t-butoxycarbonyloxy)maleimide, and $C(R_{1a})(R_{2a})=C(R_{3a})(R_{4a})$ Besides these, addition-polymerizable unsaturated compounds which are copolymerizable may generally be used.

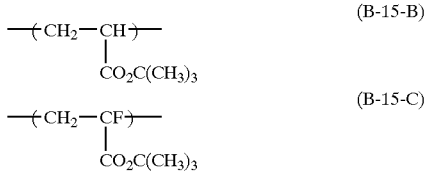

In the resin (a), the content of repeating units having a side chain containing a partial structure represented by formula (I) is regulated to preferably from 10 to 90% by mole, more preferably from 20 to 80% by mole.

The content of repeating units represented by formulae (II) to (IV) in the resin (a) is regulated to preferably from 20 to 60% by mole, more preferably from 25 to 50% by mole.

The content of repeating units having a group dissociating by the action of an acid, in the resin (a), is regulated to preferably from 15 to 50% by mole, more preferably from 20 to 40% by mole.

In the resin (a), the groups dissociating by the action of an acid dissociate by the action of an acid to form hydrophilic groups, e.g., hydroxyl groups or carboxyl groups. Thus, the resin (a) comes to have enhanced solubility in an alkaline developing solution by the action of the acid.

The weight-average molecular weight Mw of the resin (a) is preferably from 2,000 to 50,000, more preferably from 3,000 to 30,000. In case where the molecular weight thereof is too low, the composition gives a resist having reduced heat resistance. Too high molecular weights thereof impair solubility in developing solutions, resulting in reduced sensitivity and impaired resolution.

The molecular-weight dispersion degree (Mw/Mn) of the resin (a) is regulated to preferably from 1.0 to 3.0, more preferably from 1.1 to 2.0, especially preferably from 1.1 to 1.5. For lowering the molecular-weight dispersion degree, use may be made of: a method which comprises dissolving a polymer obtained by ordinary radical polymerization in a good solvent and then adding a poor solvent to the solution to remove low-molecular components, or a method in which polymerization is conducted by a living polymerization process, e.g., a living radical polymerization process. Either of these methods can be advantageously used.

The living radical polymerization process can be carried out by any of the method proposed by George et al. which uses a nitroxide, the method proposed by Sawamoto, Machaufsky, et al. which uses a metal complex, and the like.

From the standpoint of mitigating pattern roughness, the ordinary radical polymerization is preferably conducted by the dropping polymerization method (a method of radical polymerization in which one or more monomers are radical-polymerized in the presence of a radical polymerization initiator while adding one or more monomers thereto continuously or intermittently).

In the dropping polymerization method, the monomer(s) to be introduced initially into the reactor may be equal in kind and composition to the monomer(s) to be added later during the progress of radical polymerization.

The polymerization initiator also may be additionally introduced together with the monomer(s) to be added later. This method is preferred because the amount of the monomers which will remain unreacted after the polymerization can be reduced.

The amount of the resin (a) to be contained in the composition is generally from 50 to 99.5% by weight, preferably from 80 to 99% by weight, more preferably from 90 to 98% by weight, based on all solid components of the composition.

[2] (b) Compound Capable of Generating an Acid upon Irradiation with Actinic Rays or a Radiation (Hereinafter Referred to also as "Compound (a)" of "Component (a)")

The resist composition of the invention contains a compound capable of generating an acid upon irradiation with actinic rays or a radiation, in particular, $F_2$ excimer laser beam.

The compound capable of generating an acid upon irradiation with actinic rays or a radiation can be selected from the compounds generally used as compounds (acid generators) which decompose upon irradiation with actinic rays or a radiation to generate an acid.

Namely, the acid generator to be used can be suitably selected from photoinitiators for cationic photopolymerization, photoinitiators for radical photopolymerization, photodecolorants or optical color changers for dyes, compounds which generate an acid by the action of known lights used for microresists and the like (e.g., ultraviolet rays having wavelengths of from 400 to 200 nm and far ultraviolet rays, especially preferably g-line, h-line, i-line, and KrF excimer laser beam) or of ArF excimer laser beam, $F_2$ excimer laser beam, electron beams, X-rays, molecular beams, or ion beams, and mixtures of two or more thereof.

Examples of such compounds include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Pat. No. 27,992, and JP-A-3-140140; the phosphonium salts described in, e.g., D. C. Necker et al., *Macromolecules*, 17, 2468 (1984), C. S. Wen et al., *Teh, Proc. Conf. Rad. Curing ASIA*, p.478 Tokyo, October (1988), and U.S. Pat. Nos. 4,069,055 and 4,069,056; the iodonium salts described in, e.g., J. V. Crivello et al., *Macromolecules*, 10 (6), 1307 (1977), *Chem. & Eng. News*, November 28, p.31 (1988), European Patent 104,143, U.S. Pat. Nos. 339,049 and 410, 201, JP-A-2-150848, and JP-A-2-296514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 161,811, 410,201, 339,049, 233,567, 297,443, and 297,442, U.S. Pat. Nos. 4,933,377, 3,902,114, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p.478 Tokyo, October (1988). Examples thereof further include the organohalogen compounds described in, e.g., U.S. Pat. No. 3,905,815, JP-B-46-4605, JP-A-48-36281, JP-A-55-32070, JP-A-60-239736, JP-A-61-169835, JP-A-61-169837, JP-A-

62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Pholymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates and the like described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199, 672, 84,515, 044,115, 618,564, and 0,101,122, U.S. Pat. Nos. 4,371,605 and 4,431,774, JP-A-64-18143, JP-A-2-245756, and JP-A-3-140109; and the disulfone compounds described in, e.g., JP-A-61-166544.

In the invention, the compound capable of generating an acid upon irradiation with actinic rays or a radiation preferably is a compound (B1) which is capable of generating an organic sulfonic acid upon irradiation with actinic rays or a radiation.

Examples of the compound (B1) which is capable of generating an organic sulfonic acid upon irradiation with actinic rays or a radiation include a compound (B1a) which is capable of generating a fluorine-containing sulfonic acid upon irradiation with actinic rays or a radiation and a compound (B1b) which is capable of generating a fluorine-free sulfonic acid upon irradiation with actinic rays or a radiation.

It is preferred in the invention that the compound (B1) which is capable of generating an organic sulfonic acid upon irradiation with actinic rays or a radiation be used in combination with a compound (B2) which is capable of generating a carboxylic acid upon irradiation with actinic rays or a radiation.

Examples of the compound (B2) which is capable of generating a carboxylic acid upon irradiation with actinic rays or a radiation include a compound (B2a) which is capable of generating a fluorine-containing carboxylic acid upon irradiation with actinic rays or a radiation and a compound (B2b) which is capable of generating a fluorine-free carboxylic acid upon irradiation with actinic rays or a radiation.

(B1a) Compound Which is Capable of Generating a Fluorine-Containing Sulfonic Acid upon Irradiation with Actinic Rays or a Radiation Examples of the compound which is capable of generating a fluorine-containing sulfonic acid upon irradiation with actinic rays or a radiation include iodonium salts represented by the following formula (PAG3) and sulfonium salts represented by the following formula (PAG4).

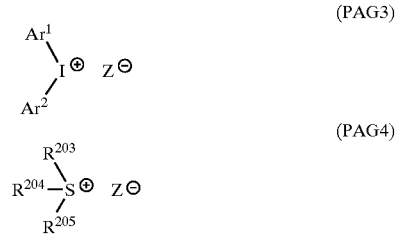

In the formulae, $Ar^1$ and $Ar^2$ each independently represents a substituted or unsubstituted aryl group. $R^{203}$, $R^{204}$, and $R^{205}$ each independently represents a substituted or unsubstituted alkyl group or aryl group.

$Z^-$ represents a sulfonic acid anion having at least one fluorine atom.

Two of $R^{203}$, $R^{204}$, and $R^{205}$ may be bonded to each other through a single bond or substituent of each. $Ar^1$ and $Ar^2$ may also be bonded to each other likewise.

The aryl groups represented by $Ar^1$, $Ar^2$, $R^{203}$, $R^{204}$, and $R^{205}$ preferably are aryl groups having 6 to 14 carbon atoms. The alkyl groups preferably are alkyl groups having 1 to 8 carbon atoms.

Preferred examples of substituents for the aryl groups include alkoxy groups having 1 to 8 carbon atoms, alkyl groups having 1 to 8 carbon atoms, alkoxycarbonyl groups having 2 to 9 carbon atoms, alkylcarbonylamino groups having 2 to 9 carbon atoms, nitro group, carboxyl group, hydroxyl group, halogen atoms, and phenylthio group. Preferred examples of substituents for the alkyl groups include alkoxy groups having 1 to 8 carbon atoms, aryl groups having 6 to 14 carbon atoms, arylcarbonyl groups having 7 to 15 carbon atoms, carboxyl group, and halogen atoms.

Preferred examples of the sulfonic acid anion represented by $Z^-$ include aliphatic hydrocarbons having 1 to 20 carbon atoms and at least one fluorine atom and aromatic hydrocarbons having 6 to 20 carbon atoms and at least one fluorine atom. These hydrocarbons may have one or more substituents. Examples of the substituents include optionally fluorinated alkoxy groups having 1 to 10 carbon atoms, optionally fluorinated alkoxycarbonyl groups having 2 to 11 carbon atoms, phenylamino group, phenylcarbonyl group, halogen atoms, and hydroxy group. Examples of the substituents for the aromatic hydrocarbons further include alkyl groups having 1 to 15 carbon atoms.

With respect to aliphatic sulfonic acid anions, the anions having a fluorine atom on the α-carbon atom of the sulfonic acid especially have a high acid strength and tend to readily undergo salt interchange with anions having no fluorine atom. Perfluoroaliphatic sulfonic acids have an even higher acid strength.

Specific examples of the compound which generates a fluorinated sulfonic acid upon irradiation are shown below, but this acid generator should not be construed as being limited to these examples.
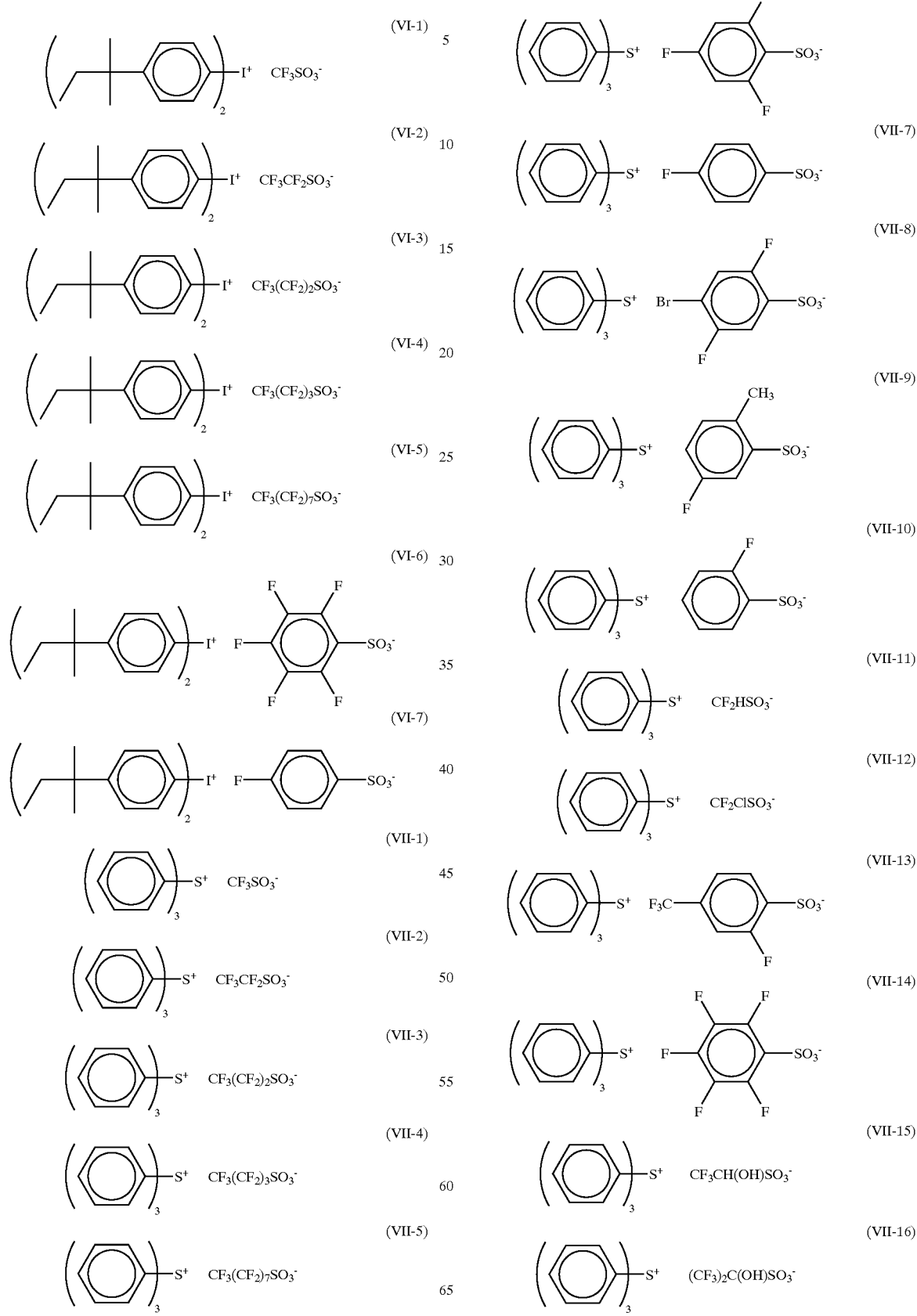

(VII-17)
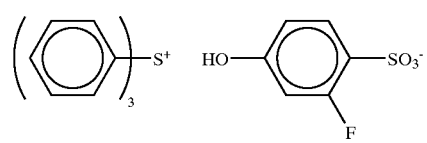
(VII-18)
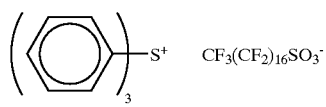
(VII-19)
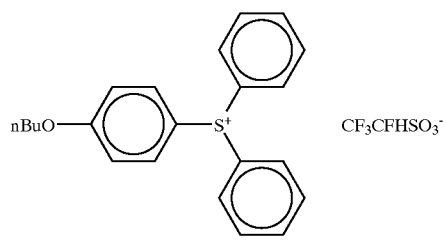
(VII-20)
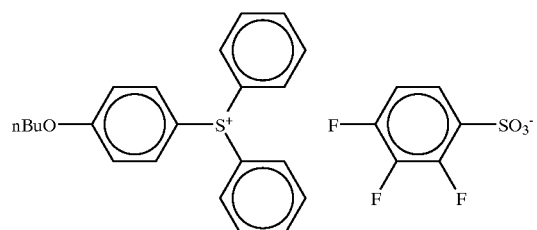
(VII-21)
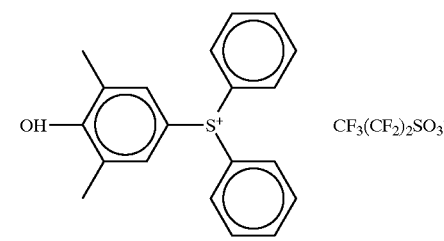
(VII-22)
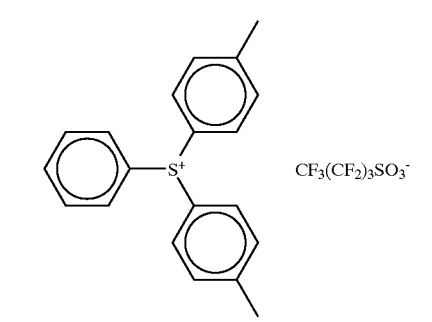
(VII-23)
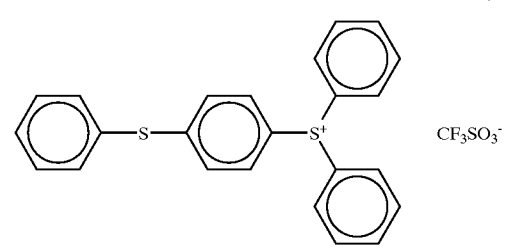
(VII-24)
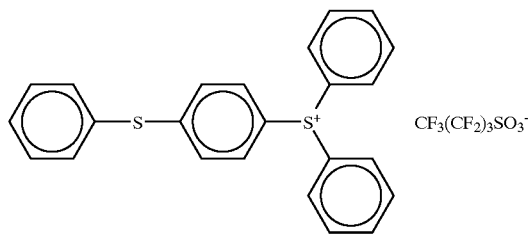
(VII-25)
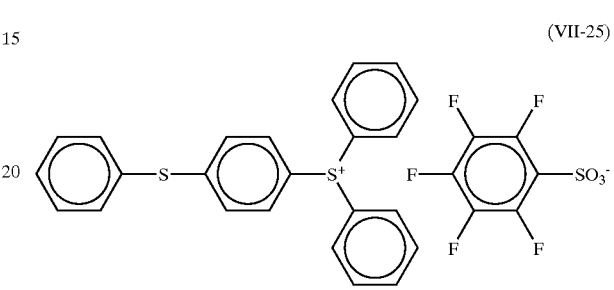
(VII-26)
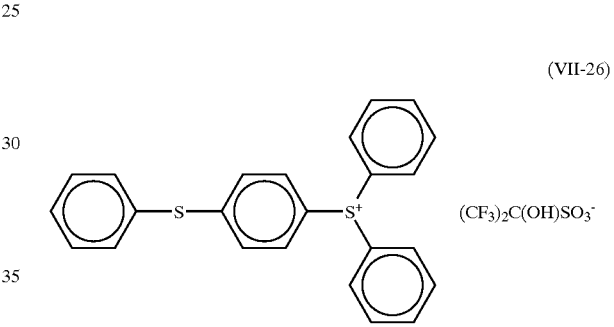
(VII-27)
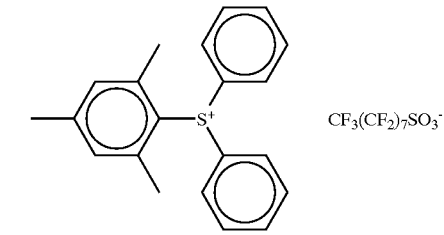
(VII-28)
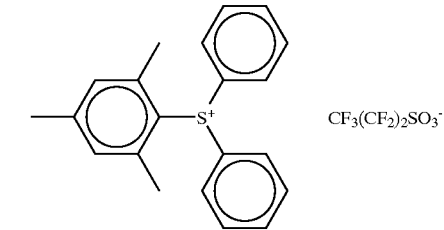
(VII-29)
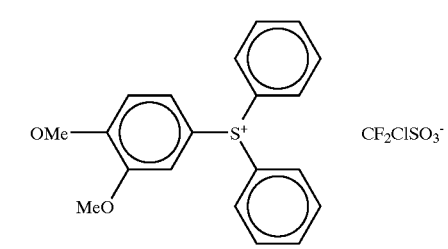

(VII-30)
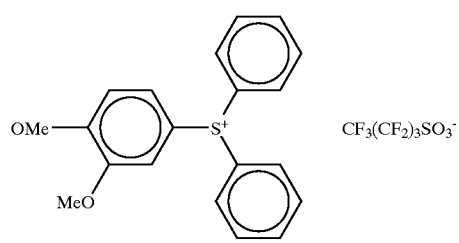
(VII-31)
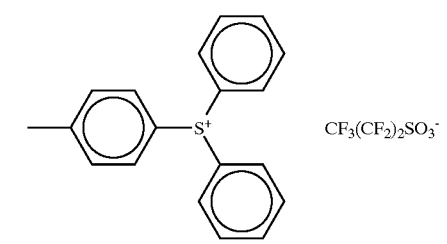
(VII-32)
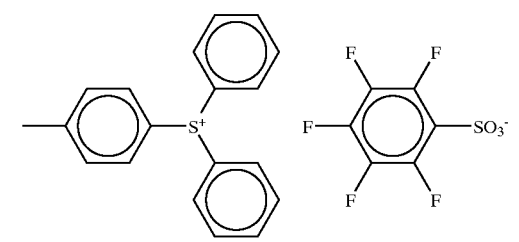
(VII-33)
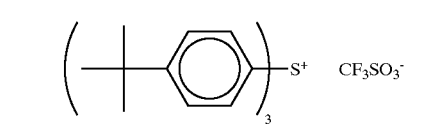
(VII-34)
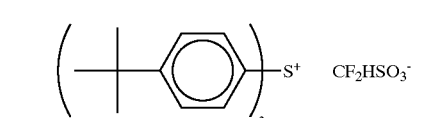
(VII-35)
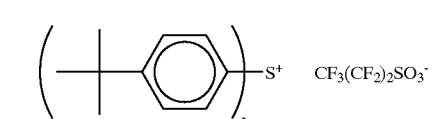
(VII-36)
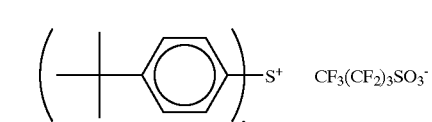
(VII-37)
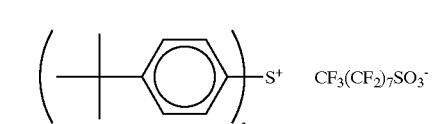
(VII-38)
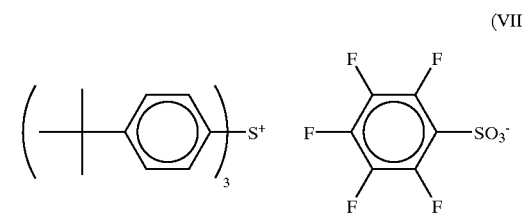
(VII-39)
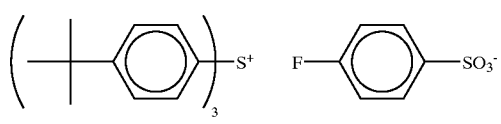
(VII-40)
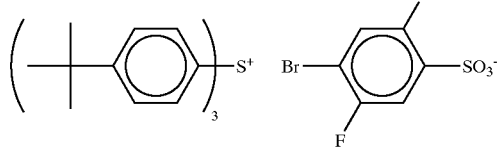
(VII-41)
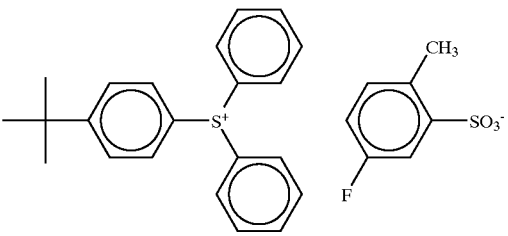
(VII-42)
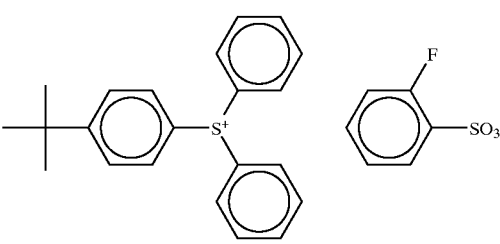
(VII-43)
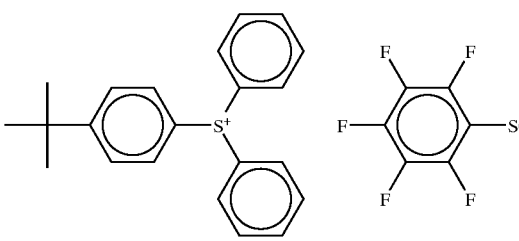
(VII-44)
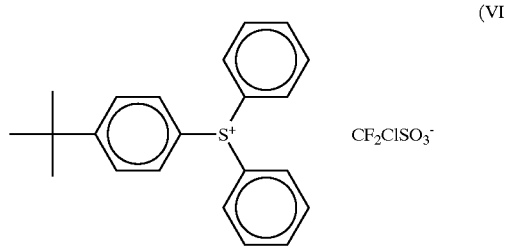

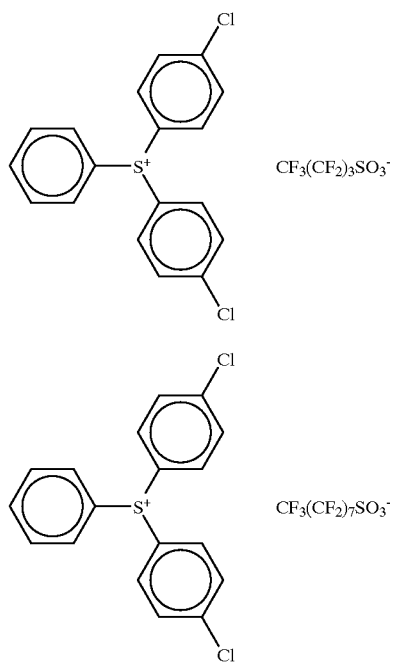 (VII-45)

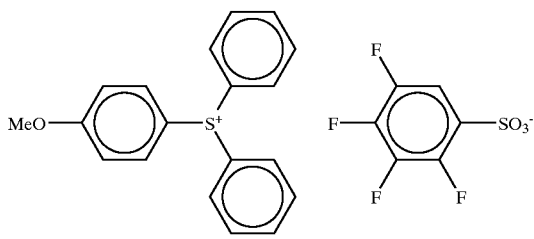 (VII-46)

(VII-47)

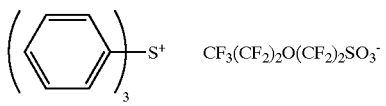 (VII-53)

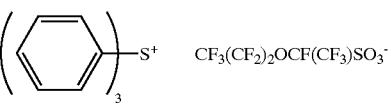 (VII-54)

 (VII-55)

 (VII-56)

(B1b) Compound Which is Capable of Generating a Fluorine-Free Sulfonic Acid upon Irradiation with Actinic Rays or a Radiation Examples of the compound which is capable of generating a fluorine-free sulfonic acid upon irradiation with actinic rays or a radiation include iodonium salts and sulfonium salts represented by formulae (PAG3) and (PAG4) wherein $Z^-$ is a sulfonic acid anion having no fluorine atom.

Specific examples thereof are shown below, but this acid generator should not be construed as being limited to these examples.

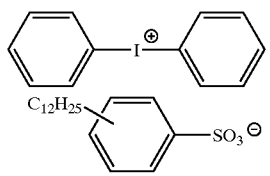 (PAG3-1)

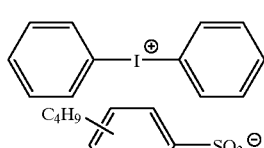 (PAG3-2)

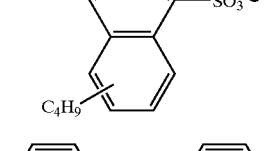 (PAG3-3)

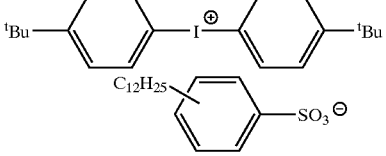

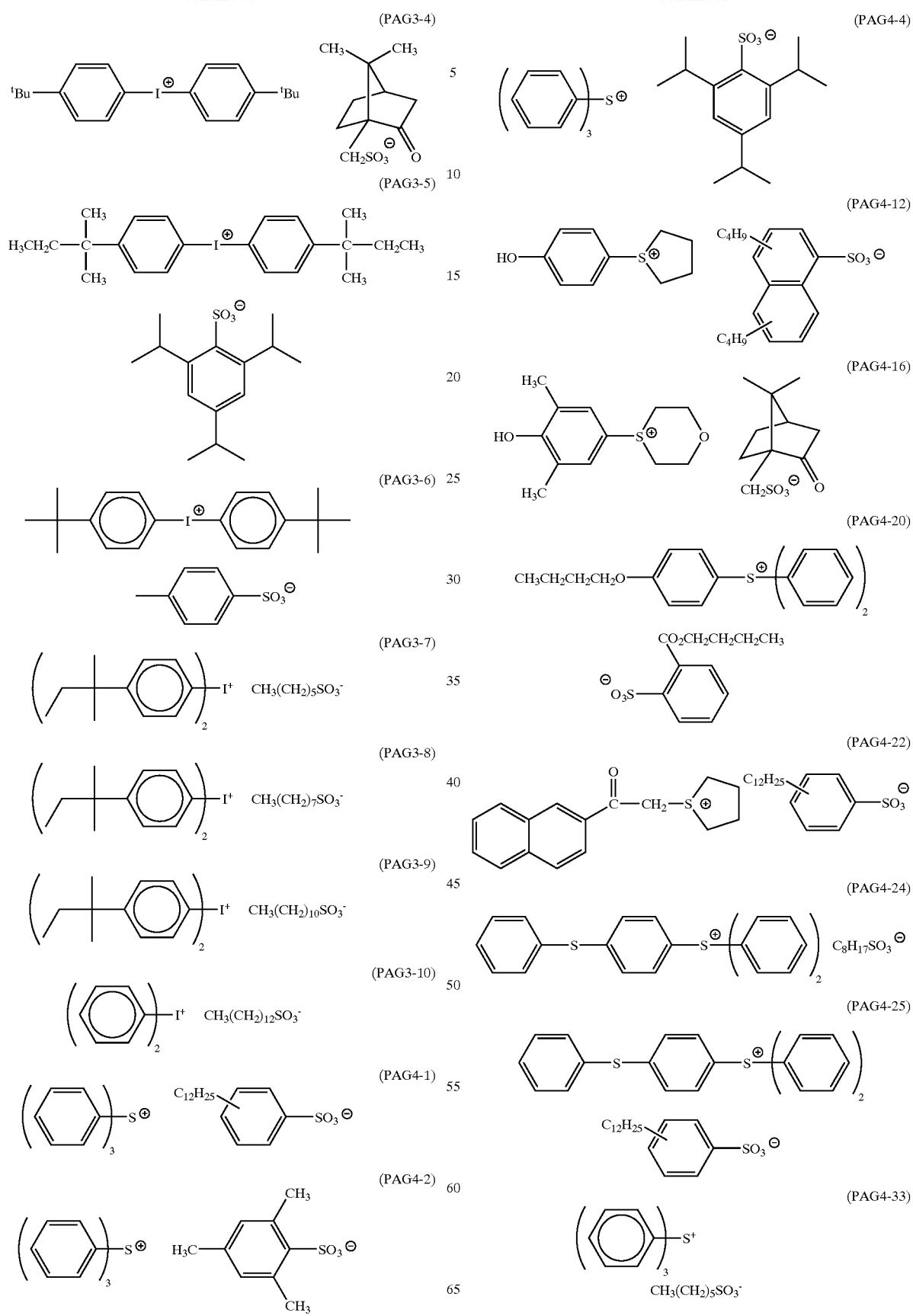

-continued (PAG4-34)
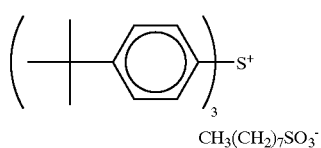
CH₃(CH₂)₇SO₃⁻

(PAG4-35)
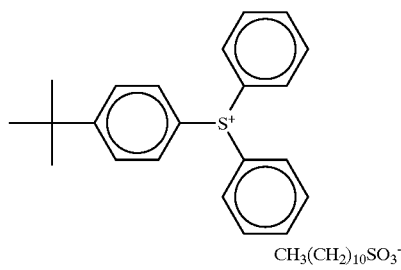
CH₃(CH₂)₁₀SO₃⁻

(PAG4-36)
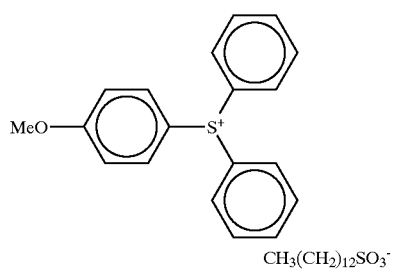
CH₃(CH₂)₁₂SO₃⁻

(PAG4-37)
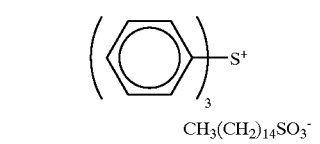
CH₃(CH₂)₁₄SO₃⁻

(PAG4-38)
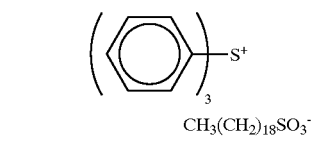
CH₃(CH₂)₁₈SO₃⁻

(PAG4-39)
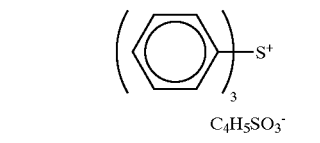
C₄H₅SO₃⁻

Examples of the compound which generates a fluorine-free sulfonic acid upon irradiation with actinic rays or a radiation further include disulfone derivatives represented by the following formula (PAG5) and iminosulfonate derivatives represented by the following formula (PAG6).

(PAG5)
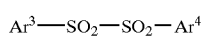

(PAG6)
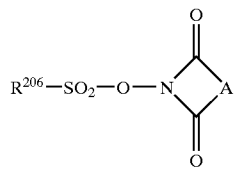

In the formulae, $Ar^3$ and $Ar^4$ each independently represents a substituted or unsubstituted aryl group. $R^{206}$ represents a substituted or unsubstituted alkyl group or aryl group, and A represents a substituted or unsubstituted alkylene group, alkenylene group, or arylene group.

Specific examples thereof are shown below, but this acid generator should not be construed as being limited to these examples.

(PAG5-1)
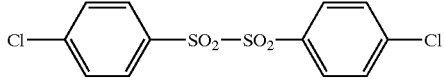

(PAG5-2)
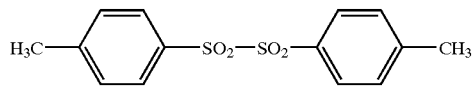

(PAG5-3)
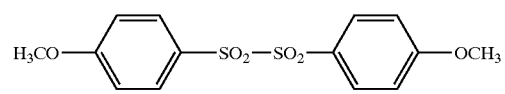

(PAG5-4)
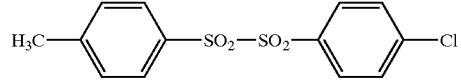

(PAG5-6)
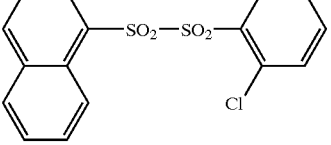

(PAG6-1)
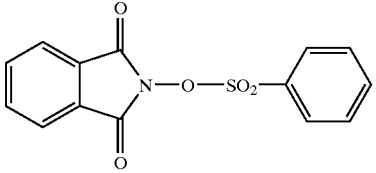

(PAG6-2)
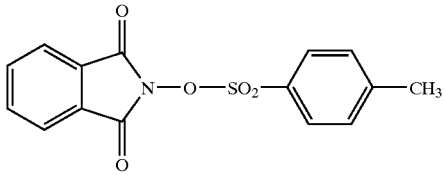

(PAG6-3)
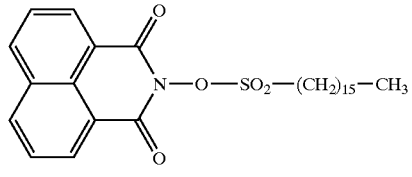

(PAG6-4)
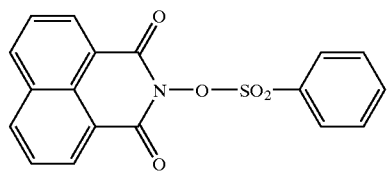

-continued

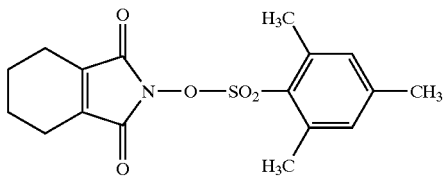
(PAG6-5)

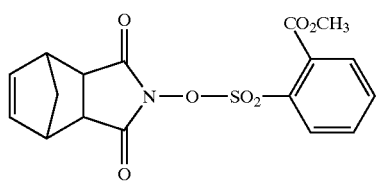
(PAG6-6)

Examples of the compound which is capable of generating a fluorine-free sulfonic acid upon irradiation with actinic rays or a radiation furthermore include diazo disulfone derivatives represented by the following formula (PAG7).

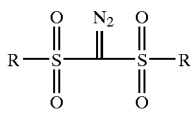
(PAG7)

In the formula, R represents a linear, branched, or cyclic alkyl group or an optionally substituted aryl group.

Specific examples thereof are shown below, but this acid generator should not be construed as being limited to these examples.

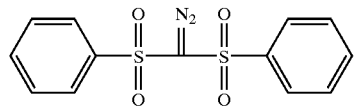
(PAG7-1)

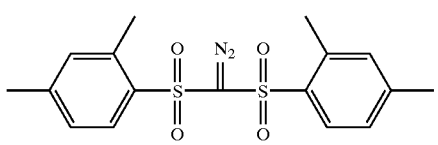
(PAG7-2)

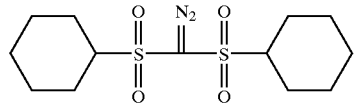
(PAG7-3)

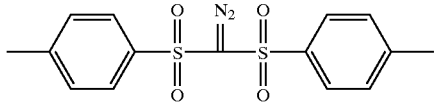
(PAG7-4)

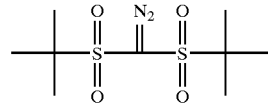
(PAG7-5)

The compounds (B1a) and (B1b) can be synthesized by reacting an aromatic compound with a periodic acid salt and subjecting the resultant iodonium salt to salt interchange with the corresponding sulfonic acid.

Alternatively, the target compounds can be synthesized by reacting an aryl Grignard reagent such as an arylmagnesium bromide with a substituted or unsubstituted phenyl sulfoxide and subjecting the resultant triarylsulfonium halide to salt interchange with the corresponding sulfonic acid. Furthermore, the target compounds can be synthesized also by other methods such as: a method in which a substituted or unsubstituted phenyl sulfoxide and the corresponding aromatic compound are subjected to condensation and salt interchange using an acid catalyst such as methanesulfonic acid/diphosphorus pentoxide or aluminum chloride; and a method in which a diaryliodonium salt and a diaryl sulfide are subjected to condensation and salt interchange using a catalyst such as copper acetate.

The salt interchange can be conducted by a method in which a halide salt is synthesized first and this salt is converted to a sulfonic acid salt using a silver reagent, e.g., silver oxide. The salt interchange may be accomplished also with an ion-exchange resin. The sulfonic acid or sulfonic acid salt to be used in the salt interchange may be a commercial one, or can be obtained, for example, by hydrolyzing a commercial sulfonic acid halide.

(B2a) Compound Which is Capable of Generating a Fluorine-Containing Carboxylic Acid upon Irradiation with Actinic Rays or a Radiation Examples of the fluorine-containing carboxylic acid (fluorinated carboxylic acid) include fluorinated aliphatic carboxylic acids and fluorinated aromatic carboxylic acids.

Examples of the fluorinated aliphatic carboxylic acids include products of the fluorination of aliphatic carboxylic acids such as acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid, and tridecanoic acid. These carboxylic acids may have one or more substituents selected from hydroxy, alkoxy groups, and halogen atoms. Preferred aliphatic carboxylic acids are ones in which the aliphatic chain contains therein a connecting group such as, e.g., an oxygen atom, sulfur atom, carbonyl group, carboxyl group, or sulfonyl group.

Preferred examples of the fluorinated aliphatic carboxylic acids include ones represented by the following formula.

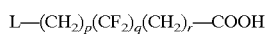
$$L-(CH_2)_p(CF_2)_q(CH_2)_r-COOH$$

In the formula, L represents a hydrogen atom or a fluorine atom. Symbols p and r each independently represent an integer of 0 to 15, and q represents an integer of 1 to 15. One or more of the hydrogen atoms or fluorine atoms of the alkyl chain in this formula each may have been replaced by an optionally fluorinated alkyl group (preferably having 1 to 5 carbon atoms), an optionally fluorinated alkoxy group (preferably having 1 to 5 carbon atoms), or hydroxy group.

Preferably, the fluorinated aliphatic carboxylic acids are products of the fluorination of saturated aliphatic carboxylic acids having preferably 2 to 20, more preferably 4 to 20 carbon atoms. When the carboxylic acid to be generated is such a carboxylic acid having 4 or more carbon atoms, this acid shows reduced diffusibility and, hence, the line width change with time which may occur in the period of from exposure to post-heating can be further diminished. Especially preferred of those are products of the fluorination of linear or branched, saturated, aliphatic carboxylic acids having 4 to 18 carbon atoms.

The fluorinated aromatic carboxylic acids preferably are products of the fluorination of aromatic carboxylic acids having 7 to 20, preferably 7 to 15, more preferably 7 to 11 carbon atoms. Examples thereof include products of the fluorination of aromatic carboxylic acids such as benzoic acid, substituted benzoic acids, naphthoic acid, substituted naphthoic acids, anthracenecarboxylic acid, and substituted anthracenecarboxylic acids (examples of the substituents include alkyl groups, alkoxy groups, hydroxy, halogen atoms, aryl groups, acyl groups, acyloxy groups, nitro group, alkylthio groups, and arylthio groups) Preferred of these are products of the fluorination of benzoic acid and substituted benzoic acids.

Those fluorinated, aliphatic or aromatic carboxylic acids are ones in which one or more of the hydrogen atoms present on the backbone excluding the carboxyl group each have been replaced by a fluorine atom. Especially preferably, the fluorinated acids are aliphatic or aromatic carboxylic acids in which all the hydrogen atoms present on the backbone excluding the carboxyl group have been replaced by fluorine atoms (perfluorinated saturated aliphatic carboxylic acids or perfluoroaromatic carboxylic acids). Such fluorinated carboxylic acids bring about higher sensitivity.

With respect to aliphatic carboxylic acid anions, the anions having a fluorine atom on the α-carbon atom of the carboxylic acid especially have a high acid strength and tend to readily undergo salt interchange with carboxylic acid anions having no fluorine atom. Perfluoroaliphatic carboxylic acids have an even higher acid strength.

Examples of the compound which is capable of generating a fluorine-containing carboxylic acid upon irradiation with actinic rays or a radiation include onium salt compounds (e.g., sulfonium salts and iodonium salts) having as a counter anion the anion of a fluorinated, aliphatic or aromatic carboxylic acid such as those shown above. Examples thereof further include imidecarboxylate compounds having a carboxylic ester group and nitrobenzyl ester compounds.

More preferred examples thereof include compounds represented by the following formulae (I) to (III). Use of such acid generators further improves sensitivity, resolution, and exposure margin. When irradiated with actinic rays or a radiation, these compounds generate a saturated aliphatic or aromatic carboxylic acid substituted with at least one fluorine atom and corresponding to X⁻ in formula (I), (II), or (III).

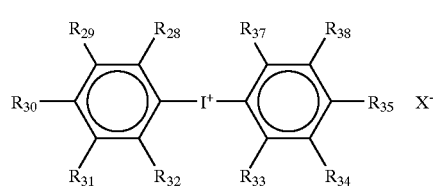

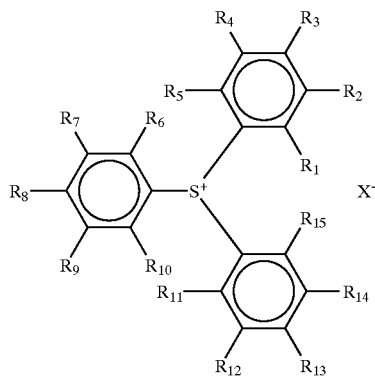

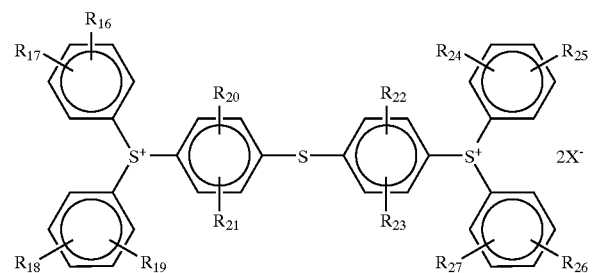

In the formulae, $R_1$ to $R_{37}$ each independently represents a hydrogen atom, a linear, branched, or cyclic alkyl group, a linear, branched, or cyclic alkoxy group, hydroxy, a halogen atom, or an —S—$R_{38}$ group, wherein $R_{38}$ represents a linear, branched, or cyclic alkyl group or an aryl group; and X⁻ is the anion of an aliphatic or aromatic carboxylic acid substituted with at least one fluorine atom.

X⁻ preferably is the anion of a perfluoroaliphatic carboxylic acid or perfluoroaromatic carboxylic acid, and especially preferably is the anion of a perfluoroalkanecarboxylic acid having 4 or more carbon atoms.

Examples of the linear or branched alkyl groups represented by $R_1$ to $R_{38}$ in formulae (I) to (III) include optionally substituted, linear or branched alkyl groups having 1 to 4 carbon atoms, such as methyl group, ethyl group, propyl group, n-butyl group, sec-butyl group, and t-butyl group. Examples of the cyclic alkyl groups include optionally substituted cycloalkyl groups having 3 to 8 carbon atoms, such as cyclopropyl group, cyclopentyl group, and cyclohexyl group.

Examples of the alkoxy groups represented by $R_1$ to $R_{37}$ include ones having 1 to 4 carbon atoms, such as methoxy group, ethoxy group, hydroxyethoxy group, propoxy group, n-butoxy group, isobutoxy group, sec-butoxy group, and t-butoxy group.

Examples of the halogen atoms represented by $R_1$ to $R_{37}$ include a fluorine atom, a chlorine atom, a bromine atom, and an iodine atom.

Examples of the aryl group represented by $R_{38}$ include ones having 6 to 14 carbon atoms, such as phenyl group, tolyl group, methoxyphenyl group, and naphthyl group. The aryl group may have one or more substituents.

Preferred examples of these substituents include alkoxy groups having 1 to 4 carbon atoms, halogen atoms (fluorine, chlorine, and iodine atoms), aryl groups having 6 to 10 carbon atoms, alkenyl groups having 2 to 6 carbon atoms, cyano, hydroxy, carboxy, alkoxycarbonyl groups, and nitro group.

The iodonium compounds or sulfonium compounds represented by formulae (I) to (III) to be used in the invention each have as the counter anion X⁻ the anion of a saturated aliphatic or aromatic carboxylic acid substituted with at least one fluorine atom.

Specific examples thereof are shown below, but these acid generators should not be construed as being limited to the following examples.

Examples of compounds represented by formula (I):

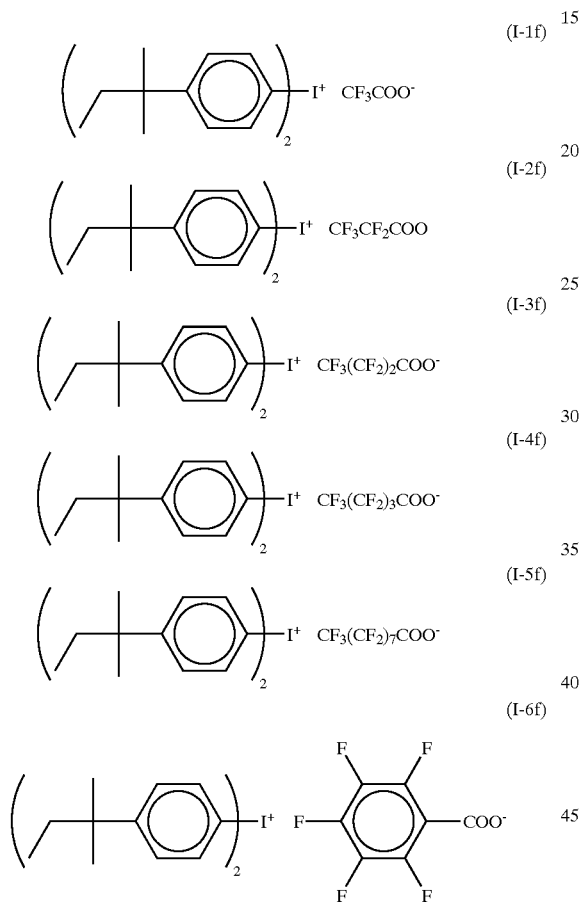

Examples of compounds represented by formula (II):

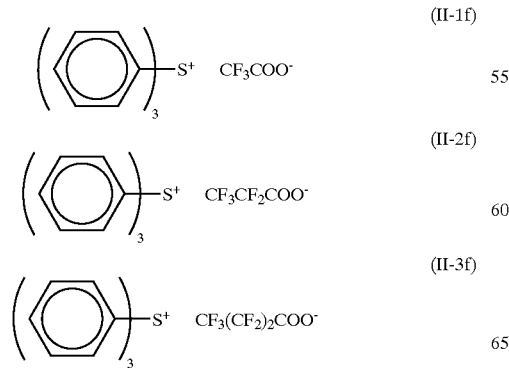

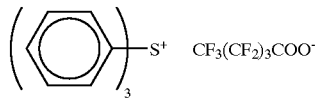

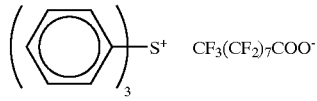

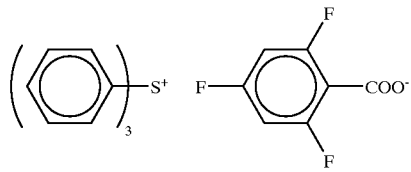

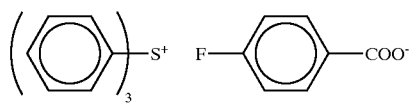

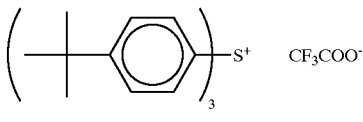

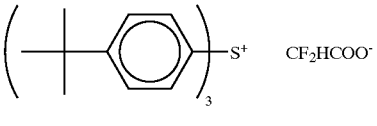

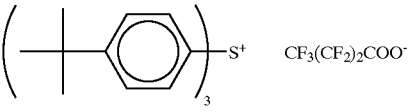

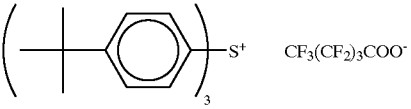

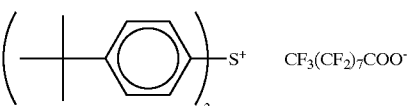

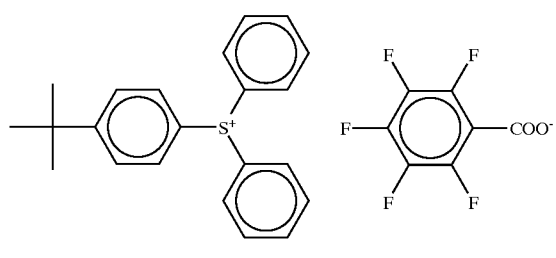
Examples of compounds represented by formula (III):
Examples of other compounds:

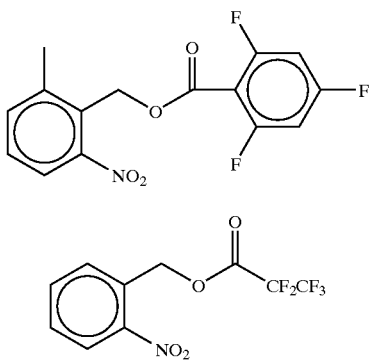

(V-3f)

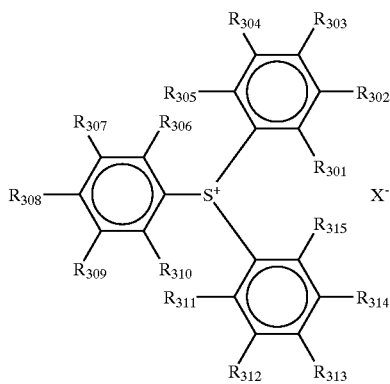

(V-4f)

The compounds represented by formula (I) can be synthesized by reacting an aromatic compound with a periodic acid salt and subjecting the resultant iodonium salt to salt interchange with the corresponding carboxylic acid.

The compounds represented by formulae (II) and (III) can be synthesized, for example, by a method comprising reacting an aryl Grignard reagent such as an arylmagnesium bromide with a substituted or unsubstituted phenyl sulfoxide and subjecting the resultant triarylsulfonium halide to salt interchange with the corresponding carboxylic acid. Alternatively, the target compounds can be synthesized by other methods such as: a method in which a substituted or unsubstituted phenyl sulfoxide and the corresponding aromatic compound are subjected to condensation and salt interchange using an acid catalyst such as methanesulfonic acid/diphosphorus pentoxide or aluminum chloride; and a method in which a diaryliodonium salt and a diaryl sulfide are subjected to condensation and salt interchange using a catalyst such as copper acetate.

The salt interchange can be conducted by a method in which a halide salt is synthesized first and this salt is converted to a carboxylic acid salt using a silver reagent, e.g., silver oxide. The salt interchange may be accomplished also with an ion-exchange resin. The carboxylic acid or carboxylic acid salt to be used in the salt interchange may be a commercial one, or can be obtained, for example, by hydrolyzing a commercial carboxylic acid halide.

It is also preferred that the fluorinated carboxylic acid to be used for constituting an anion part be one derived from a fluoroaliphatic compound produced by the telomerization method (also called the telomer method) or by the oligomerization method (also called the oligomer method). These processes for producing a fluoroaliphatic compound are described, for example, in *Fusso Kagôbutsu No Gôsei To Kinô* (supervised by Nobuo Ishikawa, published by CMC Publishing Co., Ltd., 1987) pp.117–118 and *Chemistry of Organic Fluorine Compounds II* (Monograph 187, ed. by Milos Hudlicky and Attila E. Pavlath, American Chemical Society, 1995) pp.747–752. The telomerization method is a process in which an alkyl halide having a large chain transfer constant, e.g., an iodide, is used as a telogen to conduct radical polymerization of a fluorine-containing vinyl compound, e.g., tetrafluoroethylene, to synthesize a telomer. Synthesis by the telomer method gives a mixture of compounds differing in carbon chain length. This mixture may be used as it is, or the compounds may be used after being purified.

(B2b) Compound Which is Capable of Generating a Fluorine-Free Carboxylic Acid upon Irradiation with Actinic Rays or a Radiation Examples of the compound which is capable of generating a fluorine-free carboxylic acid upon irradiation with actinic rays or a radiation include compounds represented by the following formulae (AI) to (AV).

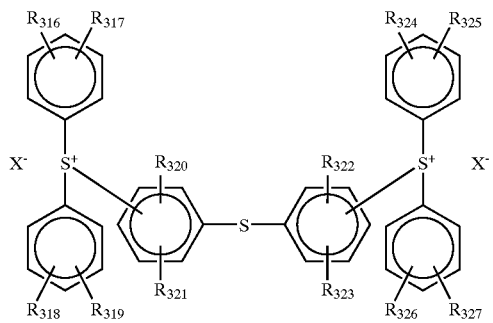

(AI)

(AII)

(AIII)

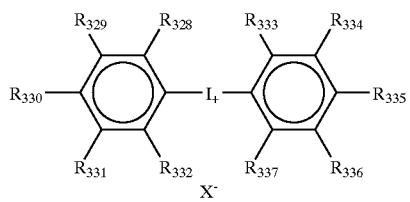

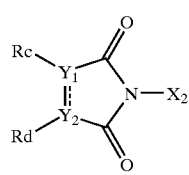

(AIV)

In the formulae, $R_{301}$ to $R_{337}$ each independently represents a hydrogen atom, a linear, branched, or cyclic alkyl group, a linear, branched, or cyclic alkoxy group, hydroxy, a halogen atom, or an —S—$R_0$ group, wherein $R_0$ represents a linear, branched, or cyclic alkyl group or an aryl group.

Ra and Rb each independently represents a hydrogen atom, nitro, a halogen atom, or an alkyl or alkoxy group, which may have one or more substituents. Rc and Rd each independently represents a halogen atom or an alkyl or aryl group, which may have one or more substituents, provided that Rc and Rd may be bonded to each other to form an aromatic ring or a noncyclic or polycyclic hydrocarbon (these rings may contain one or more oxygen and/or nitrogen atoms). $Y_1$ and $Y_2$ each represents a carbon atom, and the bond $Y_1-Y_2$ may be either a single bond or a double bond. $X^-$ represents the anion of a carboxylic acid compound represented by any of the following formulae. $X_1$ and $X_2$ each independently represents a carboxylic acid compound represented by any of the following formulae in which the carboxyl group has been converted to an ester group.

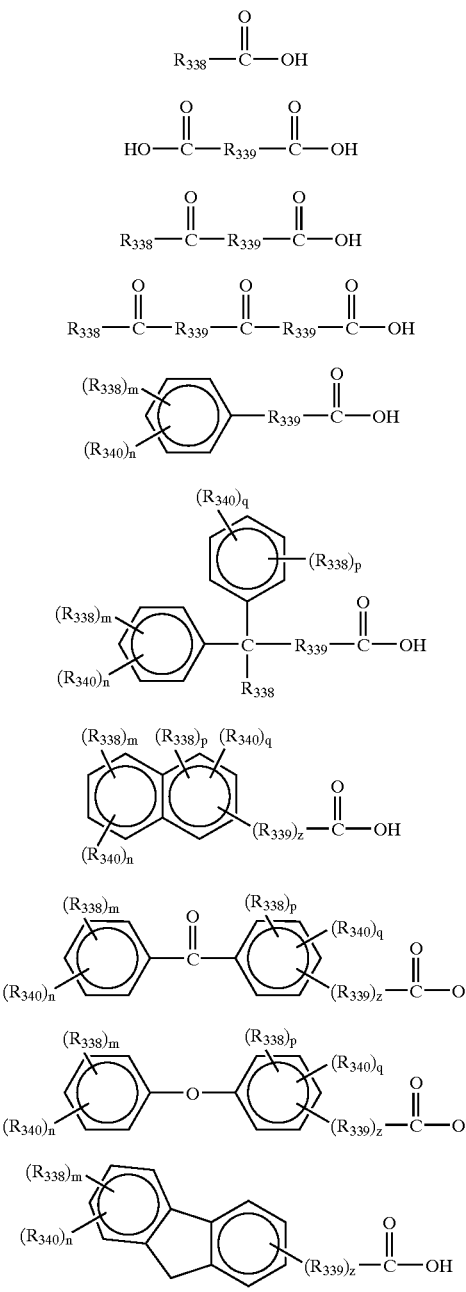

In the formulae, $R_{338}$ represents a linear, branched, or cyclic alkyl group having 1 to 30 carbon atoms (the alkyl chain may contain one or more oxygen and/or nitrogen atoms), a linear, branched, or cyclic alkenyl group having 1 to 20 carbon atoms, a linear, branched, or cyclic alkynyl group having 1 to 20 carbon atoms, a linear, branched, or cyclic alkoxy group having 1 to 20 carbon atoms, a group formed by replacing at least part of the hydrogen atoms of the alkyl group by a halogen atom and/or hydroxy group, a group formed by replacing at least part of the hydrogen atoms of the alkenyl group by a halogen atom and/or hydroxy, or a substituted or unsubstituted aryl group having 6 to 20 carbon atoms. Examples of substituents for the aryl group include alkyl groups, nitro group, hydroxy group, alkoxy groups, acyl groups, alkoxycarbonyl groups, and halogen atoms.

$R_{339}$ represents a single bond, a linear, branched, or cyclic alkylene group having 1 to 20 carbon atoms (the alkylene chain may contain one or more oxygen and/or nitrogen atoms), a linear, branched, or cyclic alkenylene group having 1 to 20 carbon atoms, a group formed by replacing part of the hydrogen atoms of the alkylene group by a halogen atom and/or hydroxy group, a group formed by replacing part of the hydrogen atoms of the alkenylene group by a halogen atom, or an alkoxyalkylene group having 2 to 20 carbon atoms. When two or more $R_{338}$'s or $R_{339}$'s are present in each formula, they may be the same or different.

$R_{340}$ represents hydroxy or a halogen atom. When two or more $R_{340}$'s are present in each formula, they may be the same or different. Symbols m, n, p, and q each independently is an integer of 0 to 3, provided that $m+n \leq 5$ and $p+q \leq 5$. Symbol z is 0 or 1.

Examples of the linear or branched alkyl groups represented by $R_{301}$ to $R_{337}$, Ra, Rb, Rc, Rd, and $R_0$ in formulae (AI) to (AV) include optionally substituted, linear or branched alkyl groups having 1 to 4 carbon atoms, such as methyl group, ethyl group, propyl group, n-butyl group, sec-butyl group, and t-butyl group. Examples of the cyclic alkyl groups include optionally substituted cycloalkyl groups having 3 to 8 carbon atoms, such as cyclopropyl group, cyclopentyl group, and cyclohexyl group.

Examples of the alkoxy groups represented by $R_{301}$ to $R_{337}$, Ra, and Rb include ones having 1 to 4 carbon atoms, such as methoxy group, ethoxy group, hydroxyethoxy group, propoxy group, n-butoxy group, isobutoxy group, sec-butoxy group, and t-butoxy group.

Examples of the halogen atoms represented by $R_{301}$ to $R_{337}$, Ra, Rb, Rc, and Rd include a fluorine atom, a chlorine atom, a bromine atom, and an iodine atom.

Examples of the aryl groups represented by $R_0$, Rc, and Rd include optionally substituted aryl groups having 6 to 14 carbon atoms, such as phenyl group, tolyl group, methoxyphenyl group, and naphthyl group.

Preferred examples of these substituents include alkoxy groups having 1 to 4 carbon atoms, halogen atoms (fluorine, chlorine, and iodine atoms), aryl groups having 6 to 10 carbon atoms, alkenyl groups having 2 to 6 carbon atoms, cyano group, hydroxy group, carboxy group, alkoxycarbonyl groups, and nitro group.

Examples of the aromatic ring or monocyclic or polycyclic hydrocarbon (these rings may contain one or more oxygen and/or nitrogen atoms) formed by Rc and Rd bonded to each other include a benzene structure, naphthalene structure, cyclohexane structure, norbornene structure, and oxabicyclo structure.

The sulfonium and iodonium compounds represented by formulae (AI) to (AIII) which can be used in the invention include ones in which the counter anion $X^-$ is at least one of the carboxylic acid compounds represented by formulae (C1) to (C10) in which the carboxyl group (—COOH) has been converted to an anion (—COO⁻).

The compounds represented by formulae (AIV) and (AV) which can be used in the invention include ones in which the substituents $X_1$ and $X_2$ are at least one of the carboxylic acid compounds represented by formulae (C1) to (C10) in which the carboxyl group (—COOH) has been converted to an ester group (—COO—).

Examples of the linear, branched, or cyclic alkyl group having 1 to 30 carbon atoms represented by $R_{338}$ (the alkyl chain may contain one or more oxygen and/or nitrogen atoms) include methyl, ethyl, propyl, butyl, pentyl, hexyl, cyclohexyl, dodecyl, 1-ethoxyethyl, and adamantyl.

Examples of the linear, branched, or cyclic alkenyl group having 1 to 20 carbon atoms include ethenyl, propenyl, isopropenyl, and cyclohexenyl.

Examples of the linear, branched, or cyclic alkynyl group having 1 to 20 carbon atoms include acetylene and propenylene.

Examples of the linear, branched, or cyclic alkoxy group having 1 to 20 carbon atoms include methoxy, ethoxy, propyloxy, butoxy, cyclohexyloxy, isobutoxy, and dodecyloxy.

Examples of the substituted or unsubstituted aryl group having 6 to 20 carbon atoms include phenyl, naphthyl, and anthranyl.

Examples of substituents for the aryl group include alkyl groups, nitro group, hydroxy group, alkoxy groups, acyl groups, alkoxycarbonyl groups, and halogen atoms.

Examples of the linear, branched, or cyclic alkylene group having 1 to 20 carbon atoms represented by $R_{339}$ (the alkylene chain may contain one or more oxygen and/or nitrogen atoms) include methylene, ethylene, propylene, butylene, isobutylene, ethoxyethylene, and cyclohexylene.

Examples of the linear, branched, or cyclic alkenylene group having 1 to 20 carbon atoms include vinylene and allylene.

Specific examples thereof are shown below, but these acid generators should not be construed as being limited to the following examples.

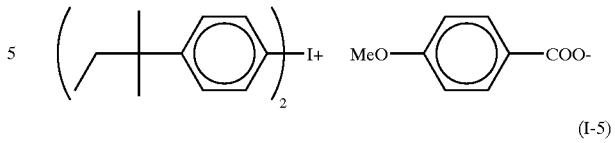
(I-1)

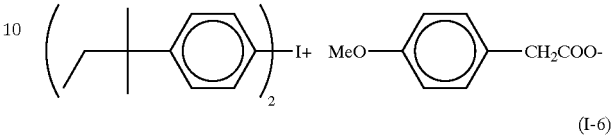
(I-2)

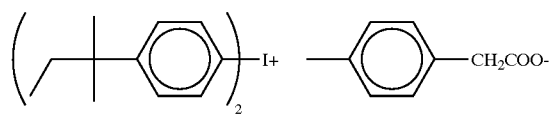
(I-3)

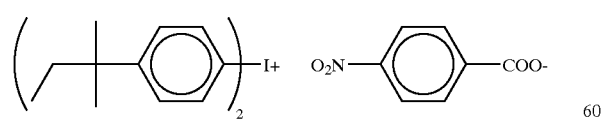
(I-4)

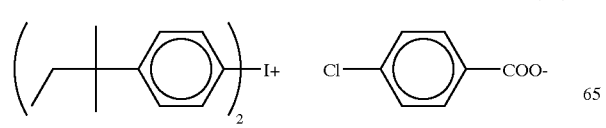
(I-5)

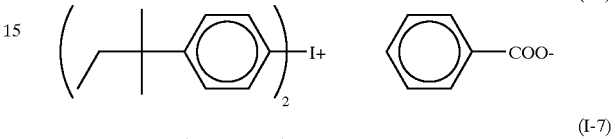
(I-6)

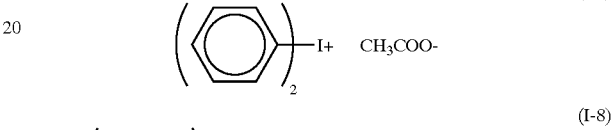
(I-7)

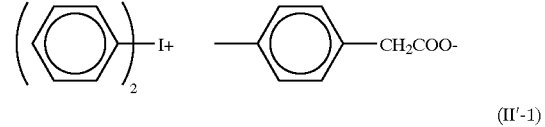
(I-8)

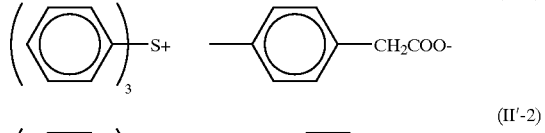
(II′-1)

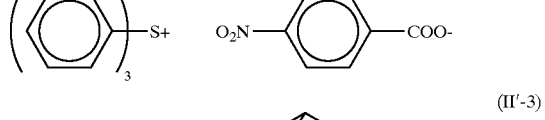
(II′-2)

(II′-3)

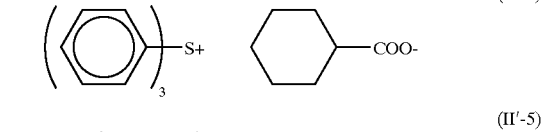
(II′-4)

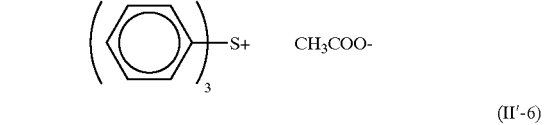
(II′-5)

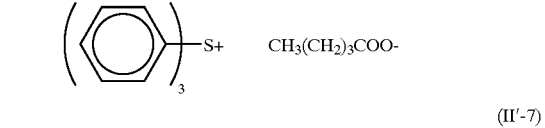
(II′-6)

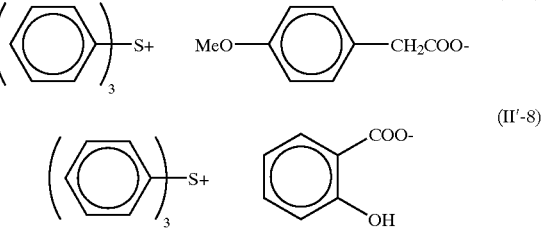
(II′-7)

(II′-8)

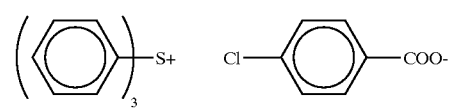 (II'-9)
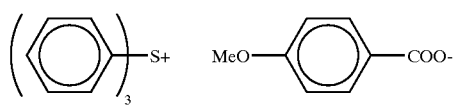 (II'-10)
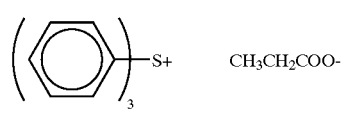 (II'-11)
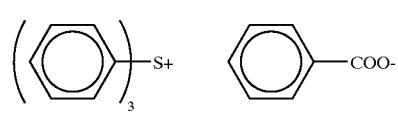 (II'-12)
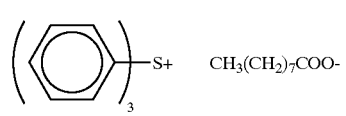 (II'-13)
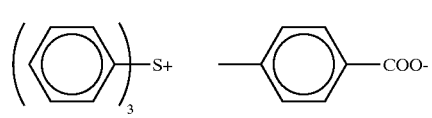 (II'-14)
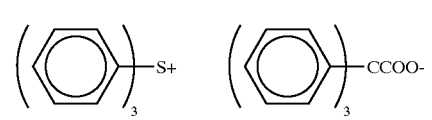 (II'-15)
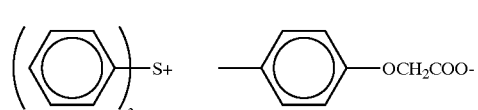 (II'-16)
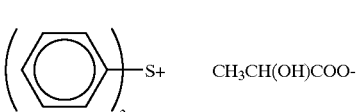 (II'-17)
 (II'-18)
 (II'-19)
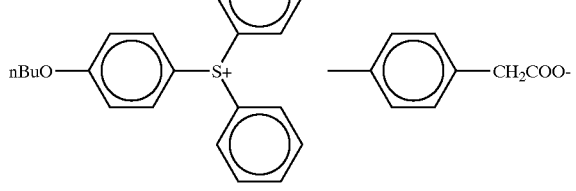
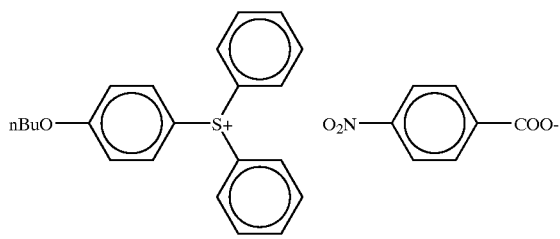 (II'-20)
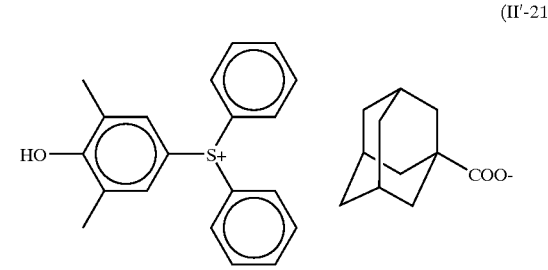 (II'-21)
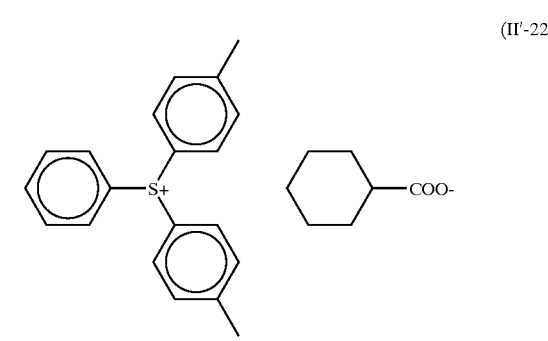 (II'-22)
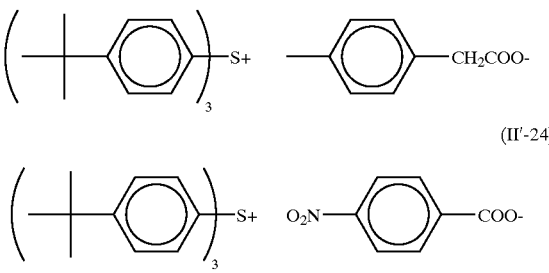 (II'-23)
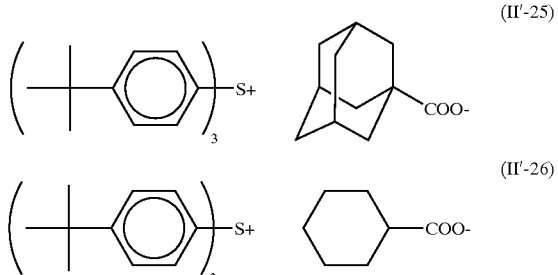 (II'-24)
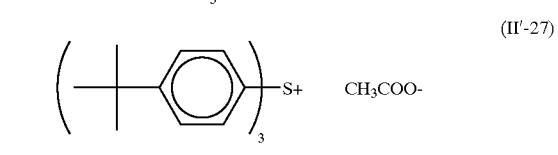 (II'-25)
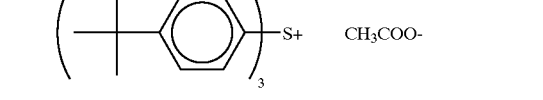 (II'-26)
(II'-27)

-continued

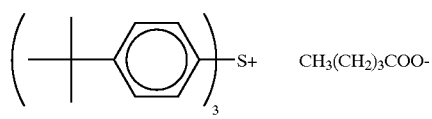
(II'-28)

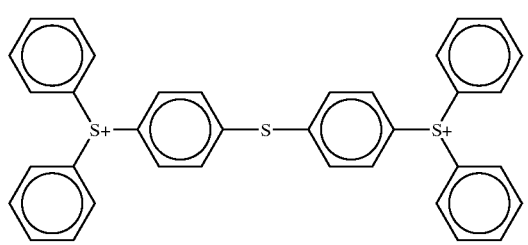
(III-1)

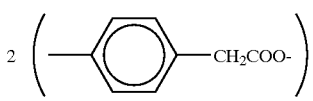
(III-2)

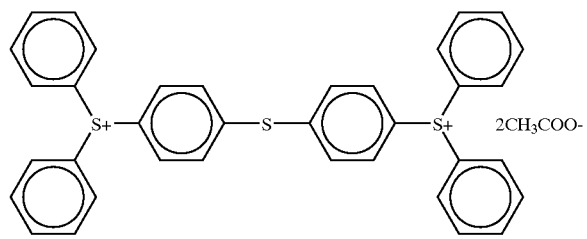

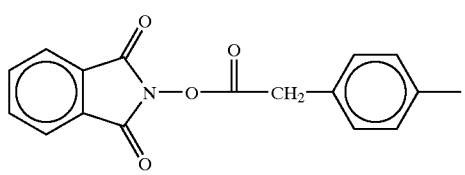
(IV-1)

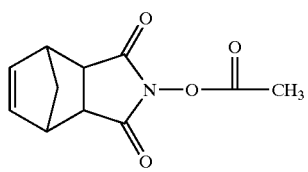
(IV-2)

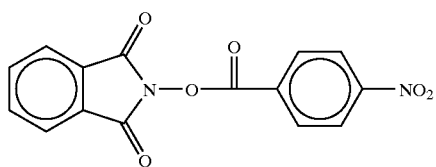
(IV-3)

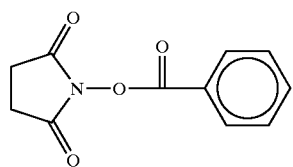
(IV-4)

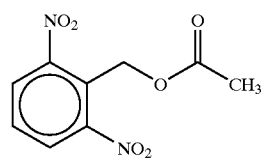
(V-1)

-continued

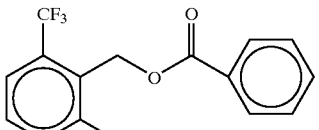
(V-2)

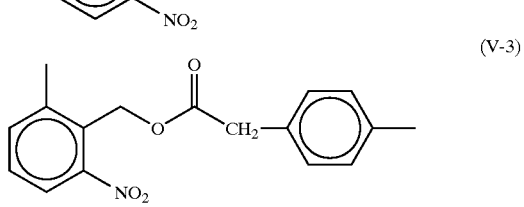
(V-3)

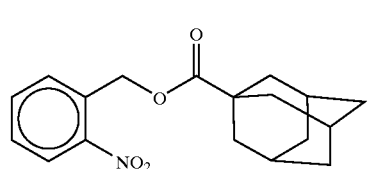
(V-4)

The compounds represented by formulae (AI), (AII), and (AIII) can be synthesized by using, e.g., the method described in U.S. Pat. No. 3,734,928 or the method described in *Macromolecules*, Vol.10, 1307(1977), *Journal of Organic Chemistry*, Vol.55, 4222(1990), or *J. Radiat. Curing*, Vol.5(1), 2(1978), and then replacing the counter anion. The compounds represented by formulae (AIV) and (AV) can be obtained by reacting an N-hydroxyimide compound with a carboxylic acid chloride under basic conditions or by reacting nitrobenzyl alcohol with a carboxylic acid chloride under basic conditions.

In the invention, ingredient (B1) and ingredient (B2) can be used in combination as ingredient (b), whereby areas around the interface (low-energy irradiated region) between the areas irradiated with actinic rays or a radiation and the unirradiated areas can have an enhanced contrast in the concentration of strong acids generated by the irradiation with actinic rays or a radiation.

The ratio of the amount of ingredient (B1) to that of ingredient (B2) to be added is generally from 100/100 to 100/0, preferably from 100/100 to 100/10, especially preferably from 100/50 to 100/20, by weight.

The total amount of ingredient (B1) and ingredient (B2) is generally from 0.5 to 20% by weight, preferably from 0.75 to 15% by weight, more preferably from 1 to 10% by weight, based on all solid components of the composition.

Ingredient (B1) and ingredient (B2) each may consist of two or more compounds.

[3] Low-molecular Compound (Ingredient (c))

The composition of the invention contains a specific low-molecular compound.

The low-molecular compound is a low-molecular compound in which the value determined with the following calculation formula (1) is from 0.1 to 0.5, preferably from 0.1 to 0.45, and the molecular weight is 3,000 or lower, preferably from 100 to 2,500.

$$[(\text{Number of carbon atoms})-(\text{number of oxygen atoms})-0.5\times(\text{number of fluorine atoms})]/(\text{number of all atoms}) \quad (1)$$

When the value of calculation formula (1) is too low, there is a problem that dry etching resistance is impaired.

Conversely, too high values of calculation formula (1) exert adverse influences on developability and on prevention of development defects.

Calculation formula (1) shown above is an empirical formula concerning dry etching resistance. This formula is well known in the field of photoresists and is called Ohnishi parameter. This formula is often used for resin design and other applications as an index with which the dry etching resistance of a material can be easily predicted from the proportions of the elements constituting the material. For ordinary organic molecules, a calculation is made with respect to the numbers of carbon and nitrogen atoms. However, in the case of compounds containing fluorine atoms, as in the invention, use of a formula dealing with the number of fluorine atoms like calculation formula (1) is thought to be appropriate.

Preferred examples of the low-molecular compound as ingredient (c) are shown below, but this compound to be used in the invention should not be construed as being limited to these examples.

(II-1)
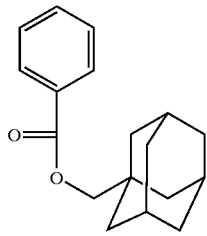

(II-2)
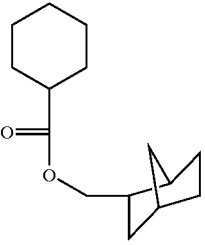

(II-3)
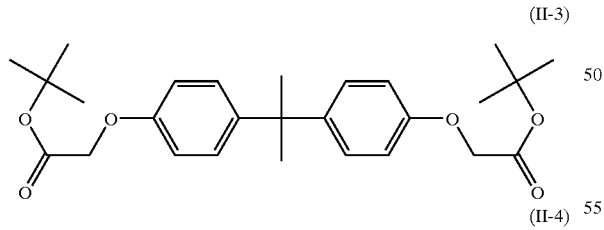

(II-4)
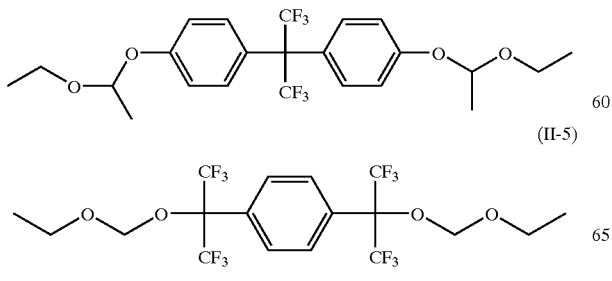

(II-5)
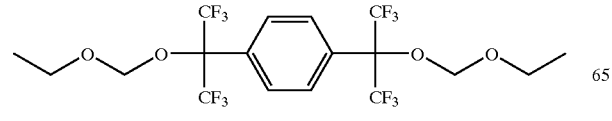

-continued (II-6)
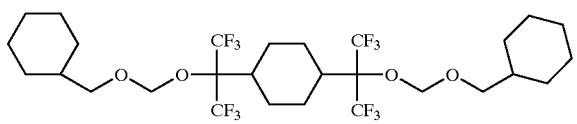

(II-7)
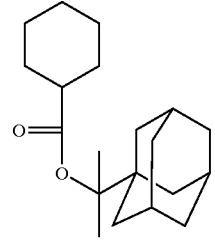

(II-8)
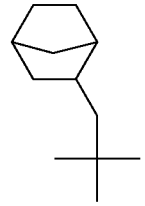

(II-9)
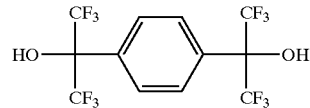

(II-10)
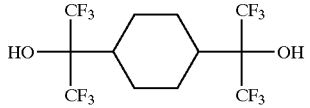

(II-11)
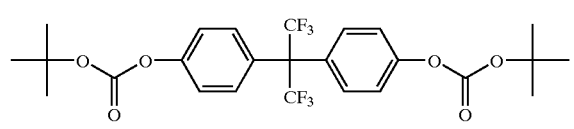

(II-12)
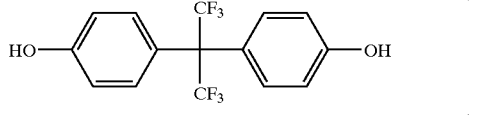

(II-13)
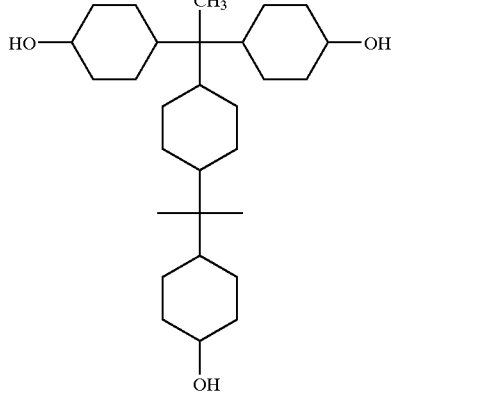

(II-14) 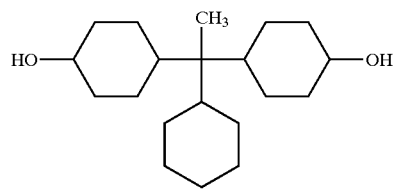
(II-15) 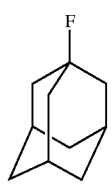
(II-16) 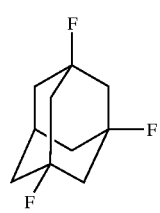
(II-17) 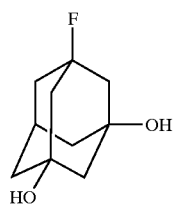
(II-18) 
(II-19) 
(II-20) 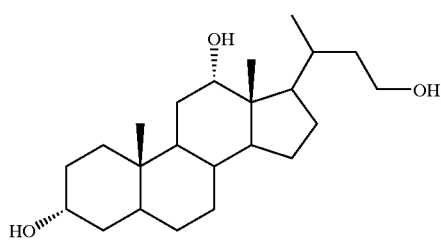
(II-21) 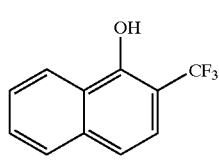
(II-22) 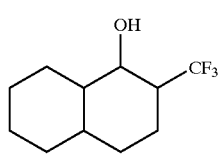
(II-23) 
(II-24) 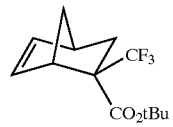
(II-25) 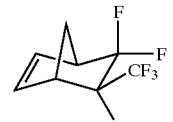
(II-26) 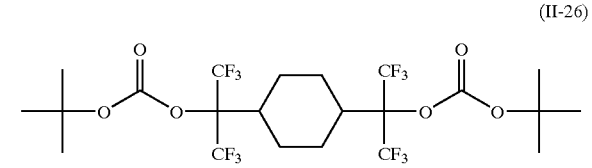
(II-27) 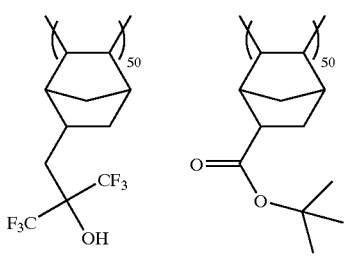
(II-28) 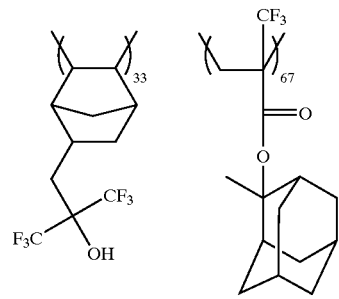
(II-29) 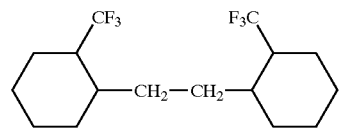
(II-30) 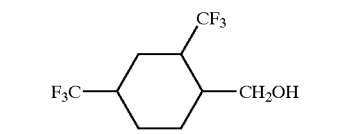
(II-31) 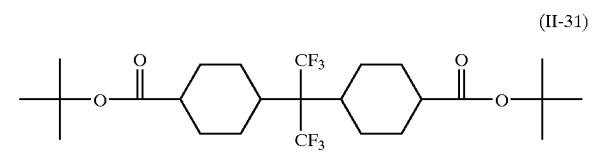

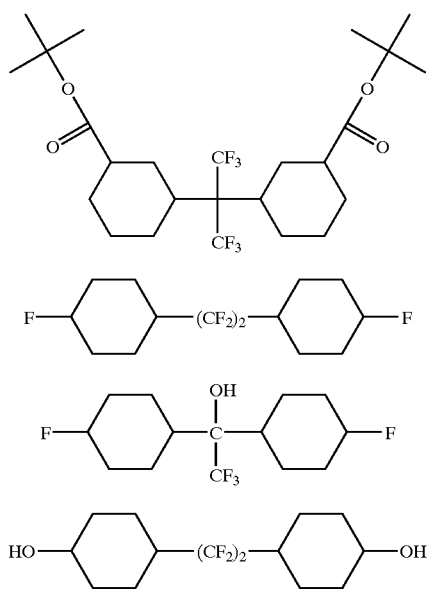

(II-32)

(II-34)

(II-35)

(II-36)

The amount of the ingredient (c) to be contained in the composition is generally from 0.1 to 20% by weight, preferably from 0.5 to 15% by weight, more preferably from 1 to 10% by weight, based on all solid components of the composition.

[4] Acid Diffusion Inhibitor

An acid diffusion inhibitor is preferably added to the chemical amplification type resist composition of the invention for the purposes of: preventing performance fluctuations (formation of T-top pattern contours, sensitivity fluctuations, pattern line width fluctuations, etc.) which may occur with time after irradiation with actinic rays or a radiation until heat treatment; preventing performance fluctuations with time after application; and preventing the excess diffusion of an acid during heat treatment after irradiation with actinic rays or a radiation (deterioration of resolution). The acid diffusion inhibitor, for example, is an organic basic compound containing basic nitrogen. It is preferred to use such a compound whose conjugate acid has a $pK_a$ of 4 or higher.

Examples thereof include structures represented by the following formulae (A) to (E).

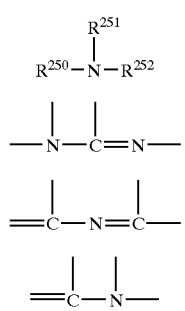

(A)

(B)

(C)

(D)

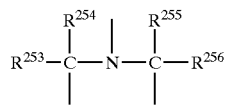

(E)

In the formulae, $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atom, or a substituted or unsubstituted aryl group having 6 to 20 carbon atoms, provided that $R^{251}$ and $R^{252}$ may be bonded to each other to form a ring.

$R^{253}$, $R^{254}$, $R^{255}$, and $R^{256}$ may be the same or different and each represent an alkyl group having 1 to 6 carbon atoms.

Preferred compounds are nitrogen-containing basic compounds having per molecule two or more nitrogen atoms differing in chemical environment. Especially preferred are compounds containing both a substituted or unsubstituted amino group and a cyclic structure containing one or more nitrogen atoms and compounds having an alkylamino group.

Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents are amino group, aminoalkyl groups, alkylamino groups, aminoaryl groups, arylamino groups, alkyl groups, alkoxy groups, acyl groups, acyloxy groups, aryl groups, aryloxy groups, nitro group, hydroxy group, and cyano group.

Especially preferred examples of these compounds include 1,5-diazabicyclo[4.3.0]-5-nonene (DBN), trioctylamine, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

However, the basic compounds should not be construed as being limited to these examples.

Those nitrogen-containing basic compounds may be used alone or in combination of two or more thereof.

The proportion of the acid generator to the organic basic compound in the composition is preferably such that the (acid generator)/(organic basic compound) molar ratio is in the range of from 2.5 to 300. When this molar ratio is less than 2.5, there are cases where the composition has reduced sensitivity and reduced resolution. When the ratio exceeds 300, there are cases where the resist pattern line width becomes large with time after exposure until heat treatment and resolution also becomes poor. The (acid generator)/ (organic basic compound) molar ratio is preferably from 5.0 to 200, more preferably from 7.0 to 150.

[5] Surfactant

The chemical amplification type resist composition of the invention preferably contains any one of or two or more of fluorine-based and/or silicone-based surfactant (fluorine-based surfactant, silicone-based surfactant, and surfactant containing both fluorine atoms and silicon atoms)

When the chemical amplification type resist composition of the invention contains the surfactant, it can show satisfactory sensitivity and resolution when irradiated with an exposure light having a wavelength of 250 nm or shorter, especially 220 nm or shorter, and give a resist pattern having satisfactory adhesion and reduced in development defects.

Examples of those surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the surfactant to be used is preferably from 0.0001 to 2% by weight, more preferably from 0.001 to 1% by weight, based on the total amount of the chemical amplification type resist composition (excluding the solvent)

[6] Solvent (Ingredient (d))

The chemical amplification type resist composition of the invention, which is applied to a substrate, is prepared by dissolving the ingredients described above in a solvent therefor. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycolmonoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

The solvent to be used in the invention preferably is a mixed solvent obtained by mixing a propylene glycol monoalkyl ether acetate, e.g., propylene glycol monomethyl ether acetate, with a propylene glycol monoalkyl ether, e.g., propylene glycol monomethyl ether or propylene glycol monoethyl ether, or with an alkyl lactate, e.g., methyl lactate or ethyl lactate.

The solid concentration of the composition prepared by dissolving the ingredients described above in the solvent is regulated to preferably from 3 to 15% by weight, more preferably from 5 to 10% by weight.

In the production of precision integrated-circuit elements or in similar processes, the step of resist pattern formation on a resist film can be conducted in the following manner. The composition of the invention is applied to a substrate (e.g., a silicon substrate coated with silicon dioxide or a transparent substrate such as a glass substrate or ITO substrate). The resultant coating is irradiated with actinic rays or a radiation using a drawing apparatus and then subjected to heating, development, rinsing, and drying. Thus, a satisfactory resist pattern can be formed.

As a developing solution for the chemical amplification type resist composition of the invention can be used an aqueous solution of an alkali such as an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide, or choline, or a cyclic amine, e.g., pyrrole or piperidine. It is also possible to use a developing solution prepared by adding an appropriate amount of an alcohol, e.g., isopropyl alcohol, or a surfactant, e.g., a nonionic one, to an aqueous solution of any of those alkalis.

Preferred of those developing solutions are aqueous solutions of quaternary ammonium salts. More preferred is an aqueous solution of tetramethylammonium hydroxide or choline.

EXAMPLES

The invention will be explained below in greater detail by reference to the following Examples, but the contents of the invention should not be construed as being limited to these Examples.

<Synthesis of Resins>
Synthesis Example (1) Synthesis of Resin (B-1)

In 90 g of dry tetrahydrofuran were dissolved 10.12 g (0.1 mol) of isobutyl vinyl ether, 18.72 g (0.05 mol) of 3-(5-bicyclo[2.2.1]hepten-2-yl)-1,1,1-trifluoro-2-(trifluoromethyl)-2-propanol, and 52.86 g (0.18 mol) of 2-methyl-2-adamantyl 2-trifluoromethylacrylate. After the atmosphere in the reaction system was replaced with nitrogen, 4.14 g (0.017 mol) of polymerization initiator V-65 (manufactured by Wako Pure Chemical Industries, Ltd.) was added thereto. This reaction system was heated at 65° C. for 8 hours while passing nitrogen therethrough. The resultant reaction mixture was cooled to −20° C., and 1.15 g (0.05 mol) of sodium hydride was added thereto. This mixture was stirred, and 8.1 g (0.05 mol) of chloromethyl cyclohexylmethyl ether was then added. After 1 hour, the reaction mixture was returned to room temperature and dropped through a filter into 1.5 L of methanol to precipitate a polymer. The polymer particles were taken out by filtration and then vacuum-dried at 100° C. to obtain a powder in an amount of about 55 g (yield, about 60%).

Analysis by gel permeation chromatography (GPC) revealed that the powder obtained had a weight-average molecular weight of 7,800 and a dispersion degree of 1.68. Analysis by $^1$H- and $^{13}$C-NMR spectroscopy revealed that the proportions of the monomer units shown below was 30/13/57 in the left-to-right order.

Resins (B-2) to (B-9) were synthesized in the same manner as in the Synthesis Example give above. In Table 1 are shown the structures of the repeating units constituting each of resins (B-2) to (B-9), the proportions of the monomer units in each resin, and the weight-average molecular weight of each resin.

In Table 1, the proportions of the monomer units in each resin are the proportions of the monomer units shown below in the left-to-right order.

TABLE 1

| Resin | Molar proportions of repeating units | Weight-average molecular weight | Dispersion degree |
|---|---|---|---|
| (B-1) | 30/13/57 | 7800 | 1.68 |
| (B-2) | 49/51 | 13000 | 1.57 |
| (B-3) | 13/18/69 | 7200 | 1.73 |
| (B-4) | 52/48 | 6900 | 2.31 |
| (B-5) | 32/36/22 | 4800 | 1.91 |
| (B-6) | 50/25/25 | 8600 | 1.53 |
| (B-7) | 45/30/25 | 8500 | 1.51 |
| (B-8) | 50/30/20 | 7600 | 1.52 |
| (B-9) | 50/25/25 | 8200 | 1.51 |

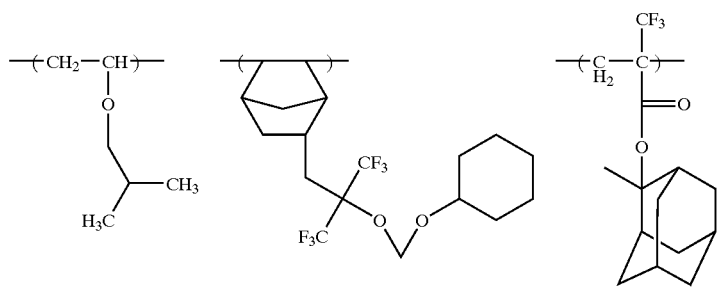

(B-1)

TABLE 1-continued
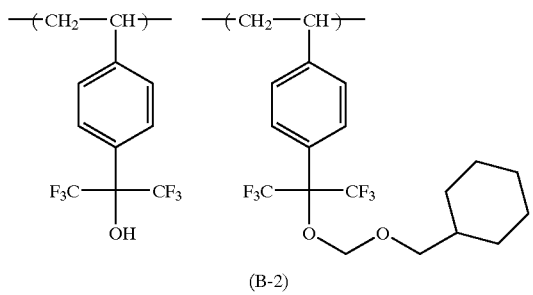
(B-2)
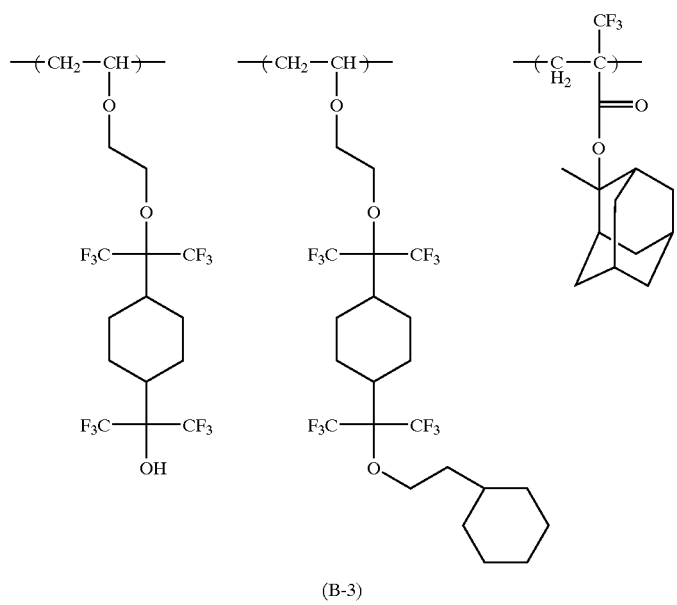
(B-3)
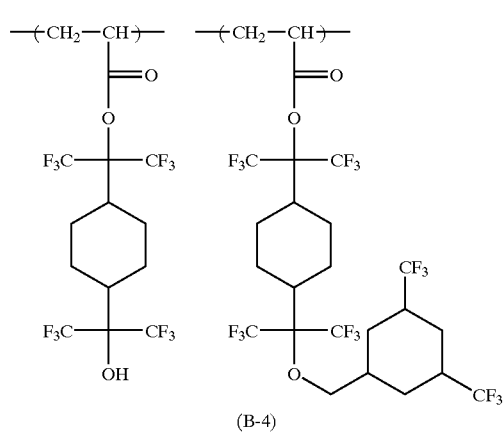
(B-4)
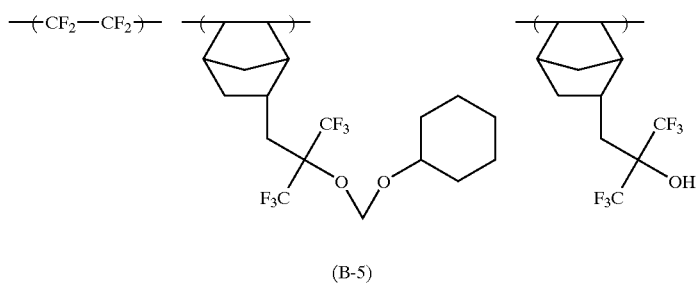
(B-5)

TABLE 1-continued

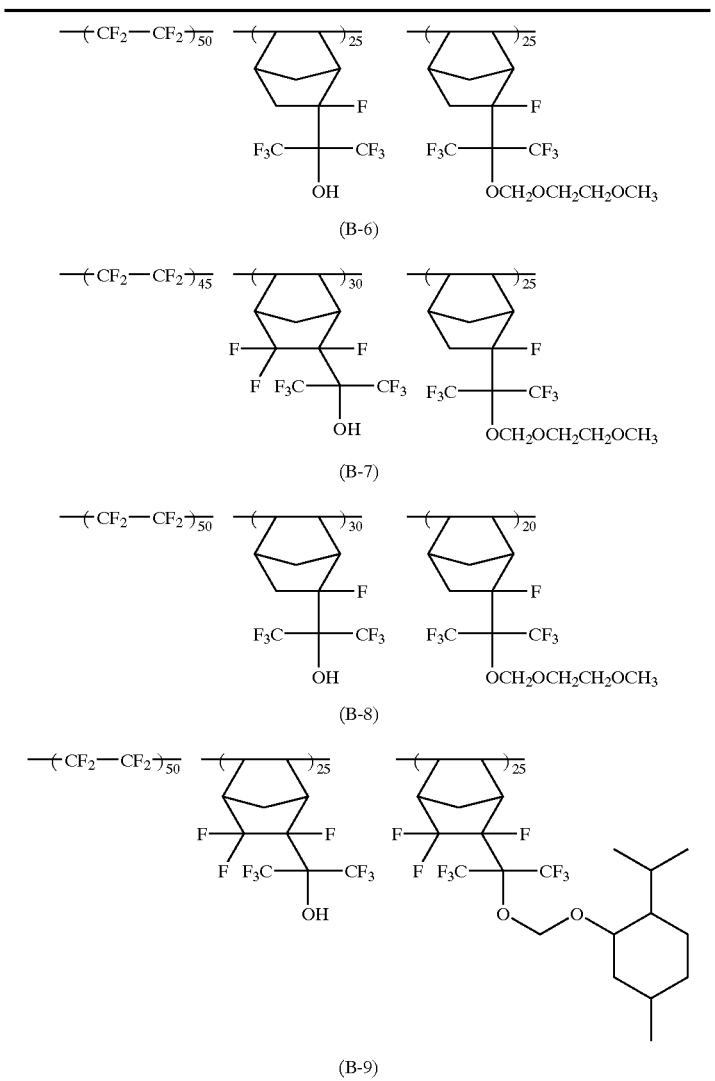

<Synthesis of Photo-acid Generators>
Synthesis Example 1 (Synthesis of Triphenylsulfonium Nonafluorobutanesulfonate (PAG-1))

In 500 mL of methanol was dissolved 20 g of triphenylsulfonium iodide. Thereto was added 12.5 g of silver oxide. This mixture was stirred at room temperature for 4 hours. The resultant reaction mixture was filtered to remove the silver compound. To this solution was added 14.9 g of nonafluorobutanesulfonic acid. The resultant solution was concentrated. A 300 mL portion of diisopropyl ether was added to the resultant oily matter, and this mixture was sufficiently stirred and then decanted to remove the diisopropyl ether. This operation was repeatedly conducted twice. The oily matter obtained was vacuum-dried. Thus, 18 g of the target compound was obtained.

Synthesis Example 2 (Synthesis of Triphenylsulfonium Acetate (PAG-2))

In 500 mL of methanol was dissolved 20 g of triphenylsulfonium iodide. Thereto was added 12.5 g of silver(I) oxide. This mixture was stirred at room temperature for 4 hours. The resultant reaction mixture was filtered to remove the silver compound. Thereafter, 4.0 g of acetic acid was added to the filtrate. The resultant solution was concentrated, and the oily matter obtained was washed twice with 300 mL of diisopropyl ether. Thus, 11.2 g of the target compound was obtained.

Examples 1 to 9 and Comparative Examples 1 and 2

In the solvent shown in Table 2 were dissolved 1.8 g of the resin shown in Table 2, the photo-acid generator and low-molecular compound in the respective amounts shown in Table 2, and 0.2 g of the organic basic compound so as to result in a solid content of 8% by weight. The resultant solution was filtered through a 0.1-μm microfilter. Thus, chemical amplification type resist compositions of Examples 1 to 9 and Comparative Examples 1 and 2 were prepared.

In Table 2, with respect to each ingredient composed of two or more components, the proportions of these are given in terms of weight ratio.

As a comparative resin was used a resin having the structure shown below (weight-average molecular weight, 8,400).

TABLE 2

| | (a) Polymer (1.8 g) | (b) Acid generator (amount, mg) | (c) Low-molecular compound (amount, mg) | Organic basic compound (0.2 g) | Surfactant (100 ppm) | (d) Solvent (weight ratio) |
|---|---|---|---|---|---|---|
| Example 1 | (B-1) | PAG-1 (40) | (II-6) (50) | 1 | none | S-1/S-2 = 8/2 |
| Example 2 | (B-2) | PAG-1 (38) | (II-10) (25) | 2 | none | S-1/S-2 = 8/2 |
| Example 3 | (B-3) | PAG-1 (40) | (II-14) (15) | 1 | none | S-1/S-2 = 8/2 |
| Example 4 | (B-4) | PAG-1 (40) | (II-16) (35) | 2 | none | S-1/S-2 = 8/2 |
| Example 5 | (B-5) | PAG-1 (35)/ PAG-2 (5) | (II-20) (40) | 1 | none | S-1/S-2 8/2 |
| Example 6 | (B-6) | PAG-1 (40) | (II-2) (50) | 3 | W-1 | S-1 |
| Example 7 | (B-7) | PAG-1 (40) | (II-12) (90) | 4 | W-2 | S-1/S-2 = 8/2 |
| Example 8 | (B-8) | PAG-1 (40) | (II-24) (40) | 5 | W-1 | S-1/S-2/S-3 = 8/1/1 |
| Example 9 | (B-9) | PAG-1 (40) | (II-14) (80) | 6 | W-1 | S-1/S-2/S-4 = 80/15/5 |
| Comparative Example 1 | (B-1) | PAG-1 (40) | none | 1 | none | S-1/S-2 = 8/2 |
| Comparative Example 2 | comparative resin (1) | PAG-1 (40) | (II-20) (40) | 1 | none | S-1/S-2 = 8/2 |

Reference numerals and signs given in Table 2 have the following meanings.
[Basic Compounds]
1: 1,5-diazabicyclo[4.3.0]-5-nonene (DBN)
2: trioctylamine
3: 3-quinuclidinol
4: hexamethylenetetramine
5: tetramethylammonium hydroxide
6: N-hydroxyethylpiperidine
[Surfactant]
W-1: Megafac F176 (fluorine-based)(manufactured by Dainippon Ink & Chemicals, Inc.)
W-2: Megafac R08 (fluorine-based and silicone-based) (manufactured by Dainippon Ink & Chemicals, Inc.)
[Solvents]
S-1: propylene glycol monomethyl ether acetate
S-2: propylene glycol monomethyl ether
S-3: ethyl lactate
S-4: γ-butyrolactone
Comparative Resin (1) (Weight-Average Molecular Weight, 8,400)

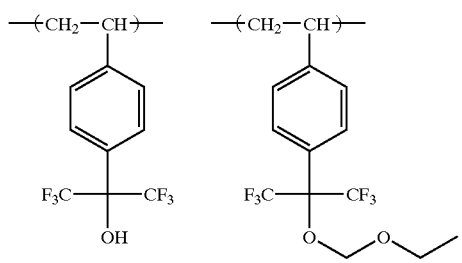

Values of calculation formula (1) for low-molecular compounds used in Examples

| | Value of calculation formula (1) |
|---|---|
| (II-2) | 0.317 |
| (II-6) | 0.214 |
| (II-10) | 0.105 |
| (II-12) | 0.303 |
| (II-14) | 0.310 |
| (II-16) | 0.327 |
| (II-20) | 0.303 |
| (II-24) | 0.486 |

The chemical amplification type resist fluids prepared above were evaluated in the following manners.
Evaluation of Dry Etching Rate:
On a silicon substrate was formed an 80 nm-thick film of antireflection film DUV30, manufactured by Brewer Science. Each of the resist fluids prepared above was applied thereon, and the coating was baked at 120° C. for 90 seconds to form a film having a thickness of 0.20 μm. The film obtained was examined for etching rate using a reactive ion etching apparatus (CSE-1110) manufactured by ULVAC. Conditions for this measurement are shown below. The etching resistance of each resist was evaluated in terms of relative etching rate based on the etching rate of the resist of Example 1, which was taken as 1.0, i.e., in terms of etching rate ratio [(etching rate of the resist of each Example)/ (etching rate of the resist of Example 1)] as an index. The larger the value of this ratio, the poorer the etching resistance. The smaller the value of this ratio, the better the etching resistance.
Chamber pressure: 40.0 Pa
RF power: 800 W
Gap: 9 mm $CF_4$ gas flow rate: 60 mL/min $O_2$ gas flow rate: 130 mL/min Time: 45 sec Evaluation of Surface Roughness After Dry Etching:

Dry etching was conducted under the conditions described above. Thereafter, the surface of each sample was examined with an SEM (manufactured by Hitachi, Ltd.). The samples which each had a smooth surface with almost no film thickness fluctuations are indicated by ○, while the sample which had a considerably rough surface with significant film thickness fluctuations is indicated by ×. The sample which was intermediate between these two ratings is indicated by Δ.

The results of the performance evaluations are shown in Table 3.

TABLE 3

|  | Evaluation of etching rate | Evaluation of surface roughness |
| --- | --- | --- |
| Example 1 | 1.00 | ○ |
| Example 2 | 0.98 | ○ |
| Example 3 | 0.95 | ○ |
| Example 4 | 1.01 | ○ |
| Example 5 | 1.05 | ○ |
| Example 6 | 1.01 | ○ |
| Example 7 | 1.03 | ○ |
| Example 8 | 0.99 | ○ |
| Example 9 | 0.98 | ○ |
| Comparative Example 1 | 1.38 | X |
| Comparative Example 2 | 1.10 | Δ |

The results given in Table 3 show that the chemical amplification type resist compositions of the invention had high etching resistance and were reduced in line edge roughness.

The invention can provide a chemical amplification type resist composition improved in etching resistance and reduced in line edge roughness.

What is claimed is:

1. A chemical amplification type resist composition comprising:

(a) a resin comprising repeating units having a side chain containing a partial structure represented by the following formula (I) and which increases the solubility in an alkaline developing solution by the action of an acid, (b) a compound capable of generating an acid upon irradiation with actinic rays or a radiation, (c) a low-molecular compound having a molecular weight of 3,000 or lower, wherein the value determined with the following calculation formula (1) is from 0.1 to 0.5:

[(number of carbon atoms)−(number of oxygen atoms)−0.5×(number of fluorine atoms)]/(number of all atoms)  (1)

and (d) a solvent:

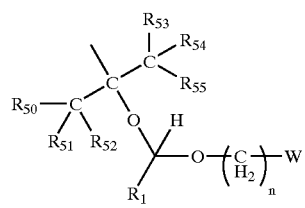

wherein $R_{50}$ to $R_{55}$ each independently represents a hydrogen atom, a fluorine atom, or a fluoroalkyl group, provided that not all of $R_{50}$ to $R_{55}$ simultaneously represent hydrogen atoms and that $R_{55}$ may be bonded to an atom of the main chain of the resin through a connecting group or directly, $R_1$ represents a hydrogen atom or an alkyl group having 1 to 4 carbon atoms, W represents an organic group having 6 to 30 carbon atoms, and n represents an integer of 0 to 4.

2. The composition according to claim 1, wherein the partial structures contained in side chains of the resin are represented by the following formula (I'):

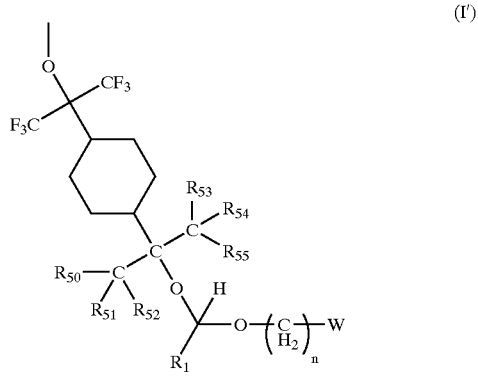

wherein $R_{50}$ to $R_{55}$ each independently represents a hydrogen atom, a fluorine atom, or a fluoroalkyl group, provided that not all of $R_{50}$ to $R_{55}$ simultaneously represent hydrogen atoms, $R_1$ represents a hydrogen atom or an alkyl group having 1 to 4 carbon atoms, W represents an organic group having 6 to 30 carbon atoms, and n represents an integer of 0 to 4.

3. The composition according to claim 1, further comprising a fluorine-based and/or silicon-based surfactant.

4. The composition according to claim 1, further comprising as an acid diffusion inhibitor a basic compound having one or more nitrogen atoms.

5. The composition according to claim 1, which is for irradiation with $F_2$ excimer laser beam having a wavelength of 157 nm.

6. The composition according to claim 1, wherein the content of the repeating units is 10 to 90% by mole based on the component (a).

7. The composition according to claim 1, wherein the value determined with the formula is from 0.1 to 0.45.

8. The composition according to claim 1, wherein the molecular weight of the component (c) is from 100 to 2500.

9. A method for forming a pattern, which comprises forming a resist film comprising the composition described in claim 1, exposing the resist film upon irradiation with the actinic rays or a radiation, and subsequently developing the resist film.

* * * * *